US 9,401,531 B2

(12) United States Patent
Iida et al.

(10) Patent No.: US 9,401,531 B2
(45) Date of Patent: Jul. 26, 2016

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Kanto Iida, Nagaokakyo (JP); Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 218 days.

(21) Appl. No.: 14/191,595

(22) Filed: Feb. 27, 2014

(65) Prior Publication Data
US 2014/0176254 A1 Jun. 26, 2014

Related U.S. Application Data

(63) Continuation of application No. PCT/JP2013/050934, filed on Jan. 18, 2013.

(30) Foreign Application Priority Data

Feb. 3, 2012 (JP) ................. 2012-022031

(51) Int. Cl.
H01P 3/08 (2006.01)
H03H 7/38 (2006.01)
H05K 1/02 (2006.01)

(52) U.S. Cl.
CPC .. H01P 3/08 (2013.01); H03H 7/38 (2013.01); H05K 1/0253 (2013.01);
(Continued)

(58) Field of Classification Search
CPC .................................. H03H 7/38; H01P 3/08

USPC ....................... 333/238, 246, 33, 34
See application file for complete search history.

(56) References Cited

U.S. PATENT DOCUMENTS 5,568,107 A * 10/1996 Buuck .................... H01P 3/088
333/238
5,631,446 A  5/1997 Quan
(Continued)

FOREIGN PATENT DOCUMENTS

EP   0 928 041 A1   7/1999
JP   06-350312 A   12/1994
(Continued)

OTHER PUBLICATIONS

Official Communication issued in International Patent Application No. PCT/JP2013/050934, mailed on Apr. 23, 2013.

Primary Examiner — Stephen E Jones
(74) Attorney, Agent, or Firm — Keating & Bennett, LLP

(57) ABSTRACT

A high-frequency signal transmission line includes a dielectric body including a plurality of dielectric sheets. A signal line is provided in the dielectric body. A connector is mounted on a first main surface of the dielectric body and electrically connected to the signal line. A ground conductor is provided on a second main surface side of the dielectric body, compared with the signal line, and faces the signal line across the dielectric sheet. In the ground conductor, conductor-missing portions are provided in which no conductors are provided in at least portions of regions overlapping with the signal line in planar in connection portions. Adjustment conductors are provided in the second main surface of the dielectric body, and overlap with at least portions of the conductor-missing portions in the planar view.

20 Claims, 18 Drawing Sheets

(52) U.S. Cl.
CPC ... *H05K 1/0225* (2013.01); *H05K 2201/09327* (2013.01); *H05K 2201/09618* (2013.01); *H05K 2201/09672* (2013.01); *H05K 2201/09727* (2013.01)

(56) References Cited

U.S. PATENT DOCUMENTS 7,351,917 B2 * 4/2008 Budell ................ H05K 1/0224 174/255
2008/0246562 A1 10/2008 Sherrer et al.
2014/0015623 A1 1/2014 Sherrer

FOREIGN PATENT DOCUMENTS

| | | |
|---|---|---|
| JP | 09-139610 A | 5/1997 |
| JP | 3161281 B2 | 4/2001 |
| JP | 2003-008310 A | 1/2003 |
| JP | 2006-186436 A | 7/2006 |
| JP | 2006-279481 A | 10/2006 |
| JP | 2009-005335 A | 1/2009 |
| JP | 2010-028345 A | 2/2010 |

* cited by examiner

F I G. 1A
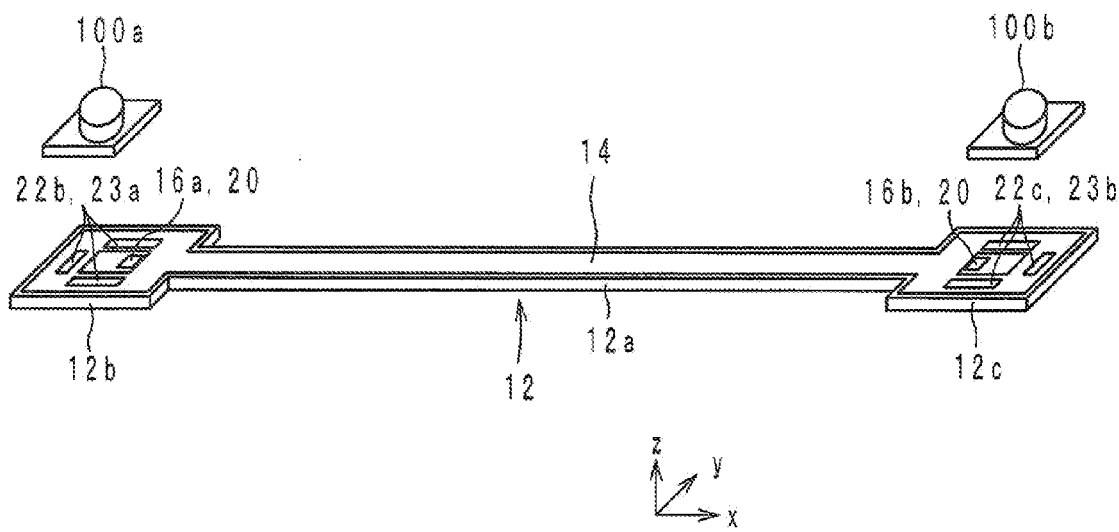
F I G. 1B
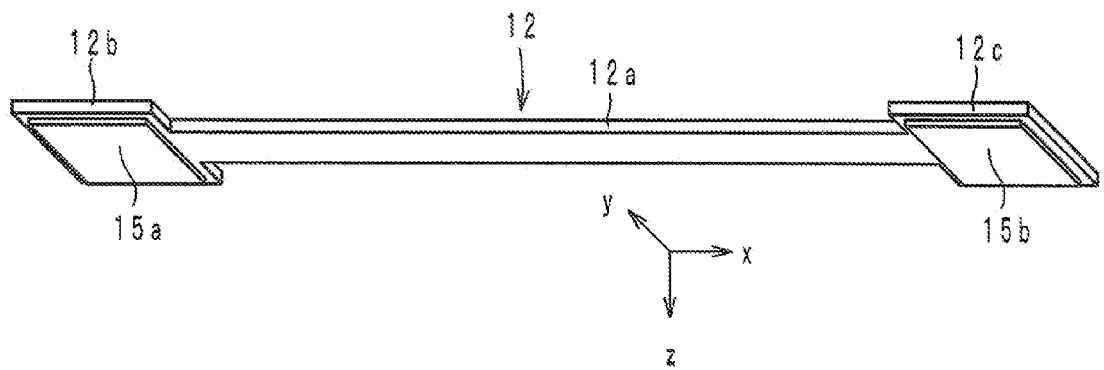

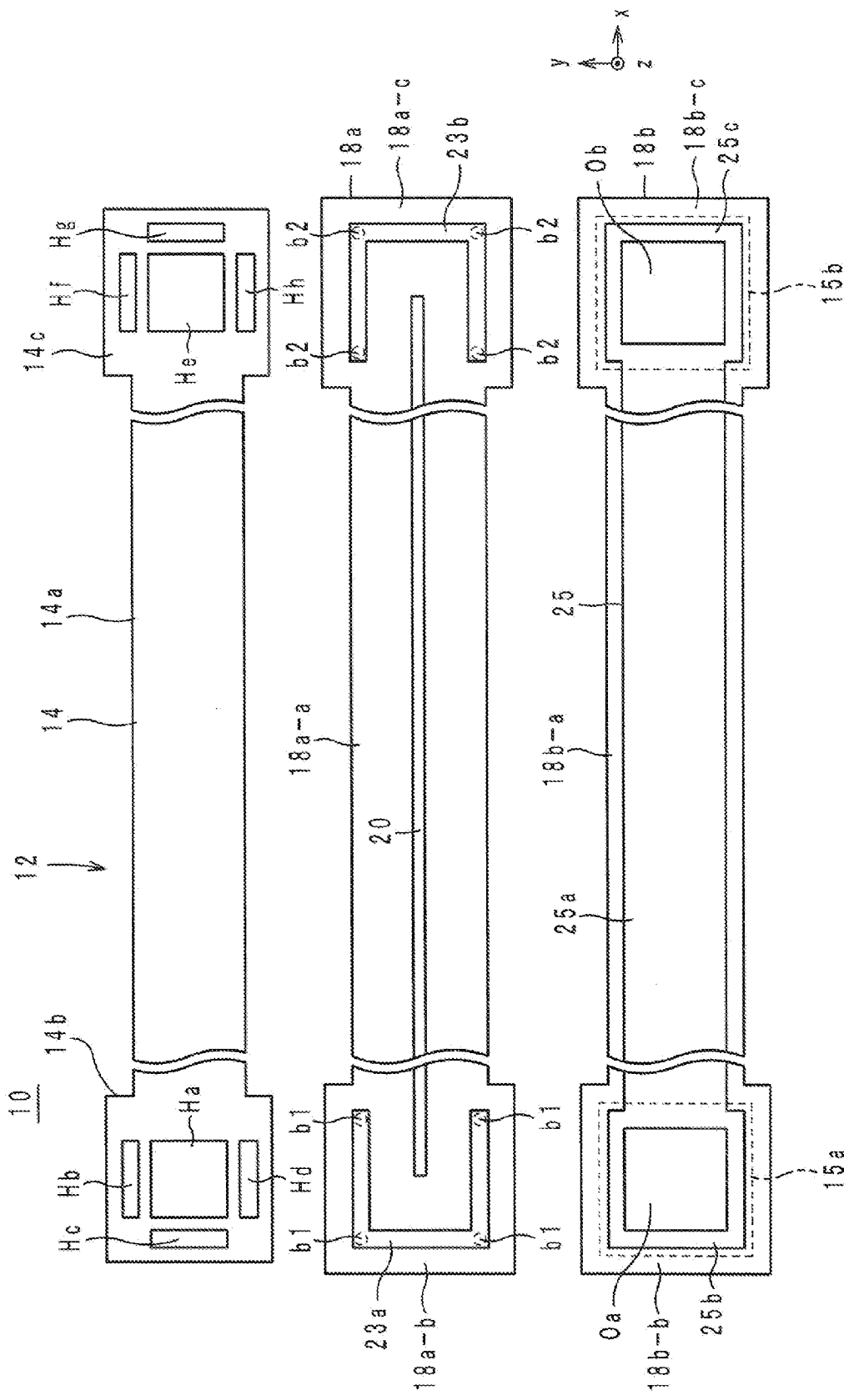

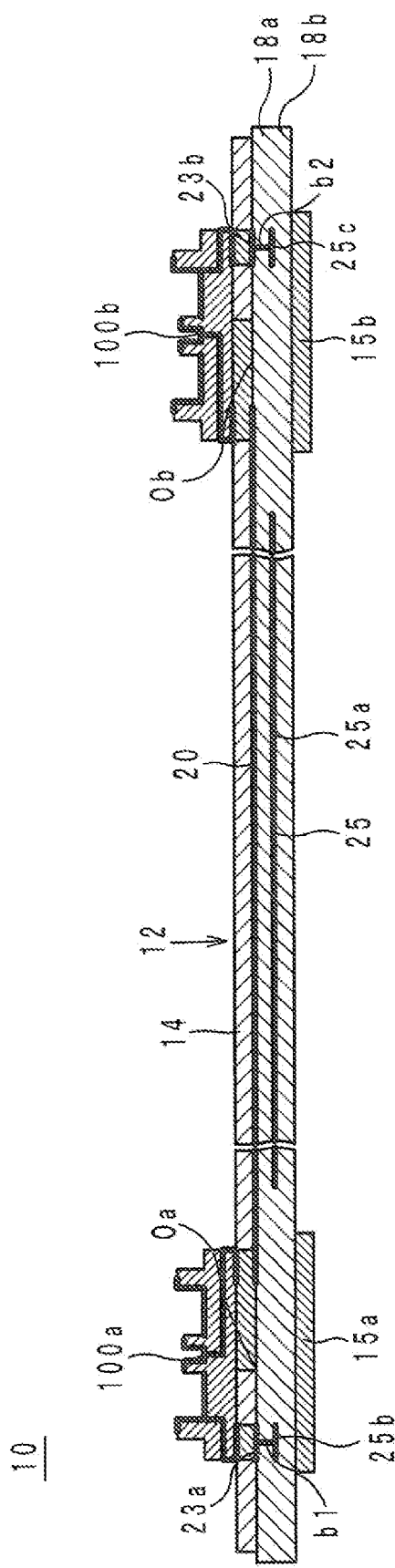

F I G. 15
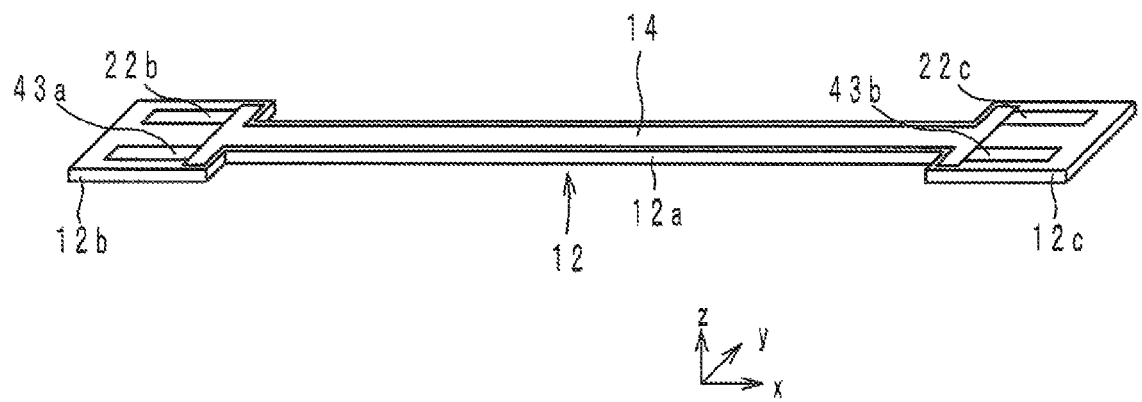
F I G. 16
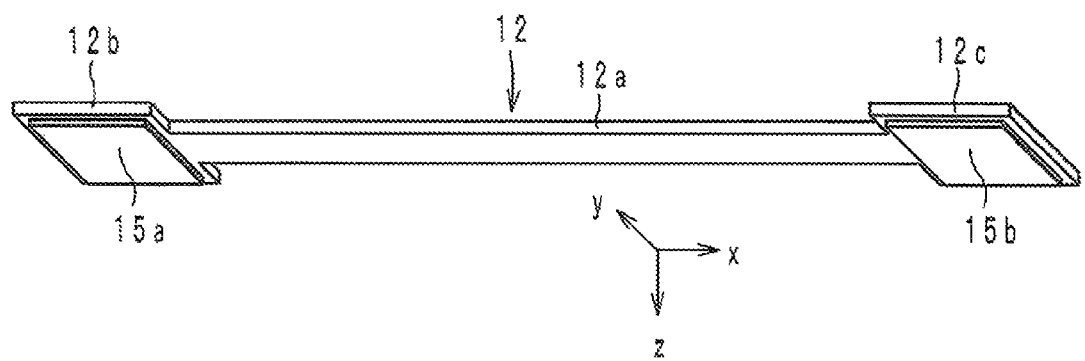

HIGH-FREQUENCY SIGNAL TRANSMISSION LINE AND ELECTRONIC DEVICE

BACKGROUND OF THE INVENTION

1. Field of the Invention

The present invention relates to a high-frequency signal transmission line and an electronic device, and more specifically relates to a high-frequency signal transmission line and an electronic device, in each of which a signal line is provided in a body including laminated insulator layers.

2. Description of the Related Art

As a high-frequency signal transmission line of the related art, a microstrip flexible substrate connection line has been known that is described in, for example, Japanese Unexamined Patent Application Publication No. 9-139610. In the microstrip flexible substrate connection line, microstrip lines are formed with sandwiching therebetween a thin flexible dielectric substrate. Such a microstrip flexible substrate connection line is thinner than a coaxial cable. Therefore, it is easy to dispose the microstrip flexible substrate connection line in a narrow space within a wireless communication terminal.

Incidentally, in a case where circuit substrates are connected to each other using the microstrip flexible substrate connection line described in Japanese Unexamined Patent Application Publication No. 9-139610, it may be considered that a coaxial connector receptacle described in, for example, Japanese Patent No. 3161281 is used. Specifically, the coaxial connector receptacle is mounted on one end of the microstrip flexible substrate connection line. In addition, the coaxial connector receptacle is attached to a coaxial connector plug provided in a circuit substrate, and hence, the microstrip flexible substrate connection line is connected to the circuit substrate. As a result, it becomes possible to easily connect the microstrip flexible substrate connection line to the circuit substrate.

However, in a case where the coaxial connector receptacle is applied to the microstrip flexible substrate connection line, there is a possibility that the characteristic impedance of a signal line is mismatched with respect to a predetermined characteristic impedance (for example, 50Ω). In more detail, the coaxial connector receptacle is configured by a plurality of parts. Therefore, stray capacitance or parasitic inductance easily occurs in the coaxial connector receptacle, and the characteristic impedance of the coaxial connector receptacle is easily mismatched with respect to the predetermined characteristic impedance. Furthermore, there is a possibility that coaxial connector receptacles having various structures are mounted on the microstrip flexible substrate connection line. Therefore, there is a possibility that a characteristic impedance varies with respect to each type of coaxial connector receptacle. As described above, if the characteristic impedance of the coaxial connector receptacle is mismatched with respect to the predetermined characteristic impedance, the reflection of a high-frequency signal occurs in the coaxial connector receptacle.

In addition, even in a case where the coaxial connector receptacle is not used, there is a possibility that the characteristic impedance of the signal line is mismatched with respect to the predetermined characteristic impedance, due to the following reason. In a case where the coaxial connector receptacle is not used, an external electrode, connected to the signal line, is provided on the surface of an end portion of the microstrip flexible substrate connection line. In addition, in a case where the microstrip flexible substrate connection line is connected to a circuit substrate, the external electrode is connected to a land electrode in the circuit substrate by a solder or the like. In this case, in the vicinity of the external electrode, a conductor shape or the like is different compared with the forming region of the signal line, and the characteristic impedance of an external electrode portion is different from the forming region of the signal line in some cases. As a result, there is a possibility that the characteristic impedance of the signal line is mismatched with respect to the predetermined characteristic impedance.

SUMMARY OF THE INVENTION

Accordingly, preferred embodiments of the present invention provide a high-frequency signal transmission line and an electronic device that significantly reduce or prevent mismatching of a characteristic impedance in a connector with respect to a predetermined characteristic impedance.

According to various preferred embodiments of the present invention, it is possible to obtain a high-frequency signal transmission line and an electronic device that significantly reduce or prevent mismatching of a characteristic impedance in a connector with respect to a predetermined characteristic impedance.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B are appearance perspective views of a high-frequency signal transmission line according to a first preferred embodiment of the present invention.

FIG. 2 is an exploded view of a dielectric body of the high-frequency signal transmission line according to the first preferred embodiment of the present invention.

FIG. 3 is a cross-sectional structural view of the high-frequency signal transmission line according to the first preferred embodiment of the present invention.

FIG. 15 is an appearance perspective view of a high-frequency signal transmission line according to a fourth preferred embodiment of the present invention.

FIG. 16 is an appearance perspective view of the high-frequency signal transmission line according to the fourth preferred embodiment of the present invention.

DETAILED DESCRIPTION OF THE PREFERRED EMBODIMENTS

Hereinafter, high-frequency signal transmission lines and an electronic device according to preferred embodiments of the present invention will be described with reference to drawings.

First Preferred Embodiment

Figure 4A:
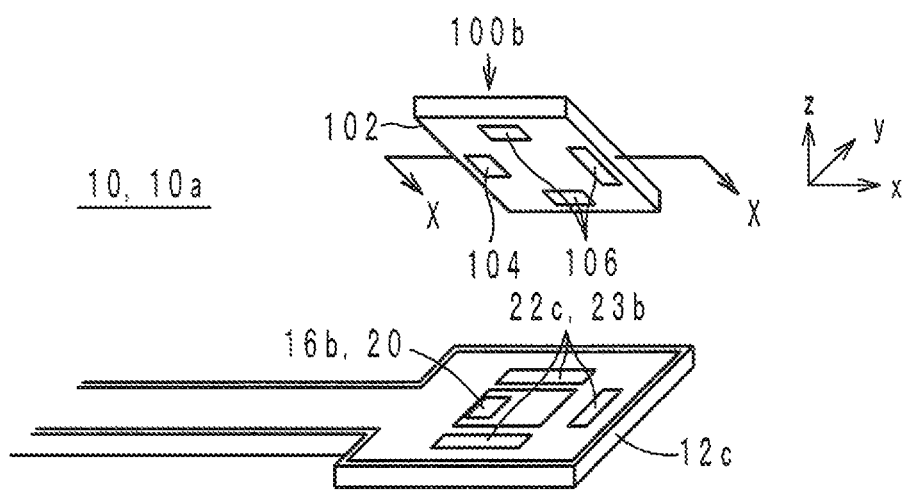
FIGS. 4A and 4B are an appearance perspective view and a cross-sectional structural view of a connector for a high-frequency signal transmission line.
Figure 4B:
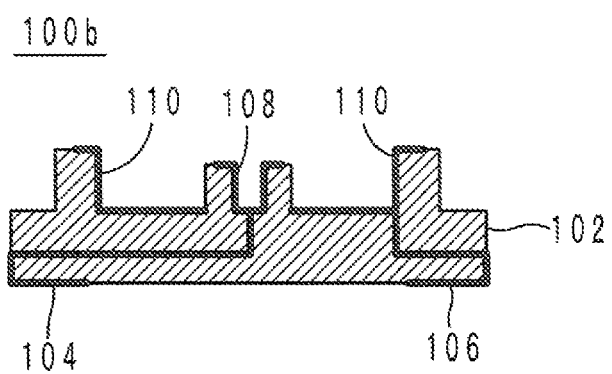

Hereinafter, the configuration of a high-frequency signal transmission line according to a first preferred embodiment of the present invention will be described with reference to drawings. FIGS. 1A and 1B are appearance perspective views of a high-frequency signal transmission line 10 according to the first preferred embodiment. FIG. 2 is a exploded view of the dielectric body 12 of the high-frequency signal transmission line 10 according to the first preferred embodiment. FIG. 3 is a cross-sectional structural view of the high-frequency signal transmission line 10 according to the first preferred embodiment. FIGS. 4A and 4B are appearance perspective view and the cross-sectional structural view of a connector 100b for the high-frequency signal transmission line 10. In FIGS. 1A and 1B to FIGS. 4A and 4B, the lamination direction of the high-frequency signal transmission line 10 is defined as a z-axis direction. In addition, the longitudinal direction of the high-frequency signal transmission line 10 is defined as an x-axis direction, and a direction perpendicular to the x-axis direction and the z-axis direction is defined as a y-axis direction.

The high-frequency signal transmission line 10 is used for, for example, connecting two high-frequency circuits within an electronic device such as a cellular phone. As illustrated in FIGS. 1A and 1B to FIG. 3, the high-frequency signal transmission line 10 includes the dielectric body 12, adjustment plates 15 (15a and 15b) (adjustment conductors), a signal line 20, terminal portions 23 (23a and 23b), a ground conductor 25, via hole conductors b1 and b2, and connectors 100a and 100b.

In a planar view from the z-axis direction, the dielectric body 12 extends in the x-axis direction, and includes a line portion 12a and connection portions 12b and 12c. The dielectric body 12 is a laminated body preferably including a protective layer 14 and dielectric sheets (insulator layers) 18 (18a and 18b), illustrated in FIG. 2, being laminated in this order from a positive direction side in the z-axis direction to a negative direction side therein. In what follows, the main surface of the dielectric body 12 on the positive direction side in the z-axis direction is referred to as a front surface, and the main surface of the dielectric body 12 on the negative direction side in the z-axis direction is referred to as a back surface.

The line portion 12a extends in the x-axis direction. The connection portions 12b and 12c are connected to an end portion of the line portion 12a on a negative direction side in the x-axis direction and an end portion of the line portion 12a on a positive direction side in the x-axis direction, respectively, and have respective rectangular or substantially rectangular shapes. The widths of the connection portions 12b and 12c in the y-axis direction are wider than the width of the line portion 12a in the y-axis direction.

The dielectric sheet 18 extends in the x-axis direction, and preferably has the same or substantially the same shape as the dielectric body 12 in a planar view from the z-axis direction. The dielectric sheet 18 is preferably made of a thermoplastic resin having flexibility, such as polyimide or liquid crystalline polymer. The thickness of the dielectric sheet 18 after lamination preferably ranges, for example, from about 50 μm to about 200 μm. Hereinafter, the main surface of the dielectric sheet 18 on the positive direction side in the z-axis direction is referred to as a front surface, and the main surface of the dielectric sheet 18 on the negative direction side in the z-axis direction is referred to as a back surface.

In addition, the dielectric sheet 18a includes a line portion 18a-a and connection portions 18a-b and 18a-c. The dielectric sheet 18b includes a line portion 18b-a and connection portions 18b-b and 18b-c. The line portions 18a-a and 18b-a configure the line portion 12a. The connection portions 18a-b and 18b-b configure the connection portion 12b. The connection portions 18a-c and 18b-c configure the connection portion 12c.

As illustrated in FIG. 2, the signal line 20 is a linear conductor provided within the dielectric body 12, and extends in the x-axis direction on the front surface of the dielectric sheet 18a. Both the respective end portions of the signal line 20 are located in the centers of the connection portions 18a-b and 18a-c in a planar view from the z-axis direction. The signal line 20 is manufactured using a metal material whose specific resistance is small and whose main component is silver or copper. In addition, both end portions of the signal line 20 preferably are gold-plated.

As illustrated in FIG. 2, the ground conductor 25 (a first ground conductor) is provided within the dielectric body 12 on the negative direction side in the z-axis direction, compared with the signal line 20 (in other words, on the back surface side of the dielectric body 12, compared with the signal line 20), and in more detail, provided on the front surface of the dielectric sheet 18b. The ground conductor 25 extends in the x-axis direction along the signal line 20 on the front surface of the dielectric sheet 18b, and faces the signal line 20 across the dielectric sheet 18a, as illustrated in FIG. 2. As a result, the signal line 20 and the ground conductor 25 form a microstrip line structure. The ground conductor 25 is manufactured using a metal material whose specific resistance is small and whose main component is silver or copper.

In addition, the ground conductor 25 includes a main conductor 25a and terminal conductors 25b and 25c. The main conductor 25a is provided on the front surface of the line portion 18b-a, and extends in the x-axis direction.

The terminal conductor 25b is provided on the front surface of the connection portion 18b-b, and defines a rectangular or substantially rectangular ring surrounding the center of the connection portion 18b-b. As a result, in the ground conductor 25, a conductor-missing portion Oa is provided in a region surrounded by the terminal conductor 25b. As a result, an end portion of the signal line 20 on the negative direction side in the x-axis direction is located within the conductor-missing portion Oa in a planar view from the z-axis direction. The terminal conductor 25b is connected to an end portion of the main conductor 25a on the negative direction side in the x-axis direction.

The terminal conductor 25c is provided on the front surface of the connection portion 18b-c, and has a ring-shaped rectangular or substantially rectangular shape surrounding the center of the connection portion 18b-c. As a result, in the ground conductor 25, a conductor-missing portion Ob is provided in a region surrounded by the terminal conductor 25c. As a result, an end portion of the signal line 20 on the positive direction side in the x-axis direction is located within the conductor-missing portion Ob in a planar view from the z-axis direction. The terminal conductor 25c is connected to an end portion of the main conductor 25a on the positive direction side in the x-axis direction.

The terminal conductor 23a is provided on the front surface of the connection portion 18a-b, and has an angular U-shape surrounding the center of the connection portion 18a-b (in other words, an end portion of the signal line 20 on the negative direction side in the x-axis direction). The terminal conductor 23a has a shape that is open toward the positive direction side in the x-axis direction. In addition, in a planar view from the z-axis direction, the terminal conductor 23a overlaps with the terminal conductor 25b.

The terminal conductor 23b is provided on the front surface of the connection portion 18a-c, and has an angular U-shape surrounding the center of the connection portion 18a-c (in other words, an end portion of the signal line 20 on the positive direction side in the x-axis direction). The terminal conductor 23b has a shape that is open toward the negative direction side in the x-axis direction. In addition, in a planar view from the z-axis direction, the terminal conductor 23b overlaps with the terminal conductor 25c.

The via hole conductor b1 penetrates the connection portion 18a-b of the dielectric sheet 18a in the z-axis direction. The via hole conductor b1 connects the terminal conductor 23a and the terminal conductor 25b to each other. The via hole conductor b2 penetrates the connection portion 18a-c of the dielectric sheet 18a in the z-axis direction. The via hole conductor b2 connects the terminal conductor 23b and the terminal conductor 25c to each other.

The protective layer 14 covers substantially the entire surface of the front surface of the dielectric sheet 18a. As a result, the protective layer 14 covers the signal line 20 and the terminal conductors 23a and 23b. The protective layer 14 is made of, for example, a flexible resin such as a resist material.

In addition, as illustrated in FIG. 2, the protective layer 14 includes a line portion 14a and connection portions 14b and 14c. The line portion 14a covers the signal line 20 by covering the entire surface of the front surface of the line portion 18a-a.

The connection portion 14b is connected to an end portion of the line portion 14a on the negative direction side in the x-axis direction, and covers the front surface of the connection portion 18a-b. In this regard, however, in the connection portion 14b, openings Ha to Hd are provided. The opening Ha is a rectangular or substantially rectangular opening provided at substantially the center of the connection portion 14b. An end portion of the signal line 20 on the negative direction side in the x-axis direction is exposed to the outside through the opening Ha, and hence, functions as an external terminal. In addition, the opening Hb is a rectangular or substantially rectangular opening provided on the positive direction side of the opening Ha in the y-axis direction. The opening Hc is a rectangular or substantially rectangular opening provided on the negative direction side of the opening Ha in the x-axis direction. The opening Hd is a rectangular or substantially rectangular opening provided on the negative direction side of the opening Ha in the y-axis direction. The terminal conductor 23a is exposed to the outside through the openings Hb to Hd, and hence, functions as an external terminal.

The connection portion 14c is connected to an end portion of the line portion 14a on the positive direction side in the x-axis direction, and covers the front surface of the connection portion 18a-c. In this regard, however, in the connection portion 14c, openings He to Hh are provided. The opening He is a rectangular or substantially rectangular opening provided at substantially the center of the connection portion 14c. An end portion of the signal line 20 on the positive direction side in the x-axis direction is exposed to the outside through the opening He, and hence, functions as an external terminal. In addition, the opening Hf is a rectangular or substantially rectangular opening provided on the positive direction side of the opening He in the y-axis direction. The opening Hg is a rectangular or substantially rectangular opening provided on the positive direction side of the opening He in the x-axis direction. The opening Hh is a rectangular or substantially rectangular opening provided on the negative direction side of the opening He in the y-axis direction. The terminal conductor 23b is exposed to the outside through the openings Hf to Hh, and hence, functions as an external terminal.

The adjustment plate 15a is provided on the back surface of the connection portion 12b of the dielectric body 12 (in other words, the back surface of the connection portion 18b-b of the dielectric sheet 18b), and a rectangular or substantially rectangular metal plate overlapping with at least a portion of the conductor-missing portion Oa in a planar view from the z-axis direction. Furthermore, the adjustment plate 15a is not electrically connected to any one of the signal line 20 and the ground conductor 25, and is maintained at a floating potential. In more detail, the adjustment plate 15a overlaps with the whole of the conductor-missing portion Oa in a planar view from the z-axis direction, and hence, overlaps with an end portion of the signal line 20 on the negative direction side in the x-axis direction. As a result, capacitance is generated between the adjustment plate 15a and an end portion of the signal line 20 on the negative direction side in the x-axis direction. Furthermore, the adjustment plate 15a protrudes out of the conductor-missing portion Oa, and hence, overlaps with the terminal conductor 25b of the ground conductor 25 in a planar view from the z-axis direction. As a result, capacitance is generated between the adjustment plate 15a and the terminal conductor 25b of the ground conductor 25.

The adjustment plate 15b is provided on the back surface of the connection portion 12c of the dielectric body 12 (in other words, the back surface of the connection portion 18b-c of the dielectric sheet 18b), and a rectangular or substantially rectangular metal plate overlapping with at least a portion of the conductor-missing portion Ob in a planar view from the z-axis direction. Furthermore, the adjustment plate 15b is not electrically connected to any one of the signal line 20 and the ground conductor 25, and is maintained at a floating potential. In more detail, the adjustment plate 15b overlaps with the whole of the conductor-missing portion Ob in a planar view from the z-axis direction, and hence, overlaps with an end portion of the signal line 20 on the positive direction side in the x-axis direction. As a result, capacitance is generated between the adjustment plate 15b and an end portion of the signal line 20 on the positive direction side in the x-axis direction. Furthermore, the adjustment plate 15b protrudes out of the conductor-missing portion Ob, and hence, overlaps with the terminal conductor 25c of the ground conductor 25 in a planar view from the z-axis direction. As a result, capacitance is generated between the adjustment plate 15b and the terminal conductor 25c of the ground conductor 25. The adjustment plates 15a and 15b are configured by, for example, copper plates or SUS plates.

The connectors 100a and 100b are mounted on the front surfaces of the connection portions 12b and 12c, respectively, and individually electrically connected to the signal line 20 and the ground conductor 25. Since the configurations of the connectors 100a and 100b are equal to each other, the configuration of the connector 100b will be cited as an example and described, hereinafter.

As illustrated in FIGS. 1A and 1B and FIGS. 4A and 4B, the connector 100b includes a connector main body 102, external terminals 104 and 106, a center conductor 108, and an external conductor 110. The connector main body 102 has a shape in which a cylinder is connected to a rectangular or substantially rectangular plate, and is manufactured using an insulating material such as a resin.

In the surface of the plate of the connector main body 102 on the negative direction side in the z-axis direction, the external terminal 104 is provided in a position in which to face an end portion of the signal line 20 on the positive direction side in the x-axis direction. In the surface of the plate of the connector main body 102 on the negative direction side in the z-axis direction, the external terminal 106 is provided in a position to correspond to the terminal conductor 23b exposed through the openings Hf to Hh.

The center conductor 108 is provided in the center of the cylinder of the connector main body 102, and connected to the external terminal 104. The center conductor 108 is a signal terminal from which a high-frequency signal is input or output. The external conductor 110 is provided on the inner peripheral surface of the cylinder of the connector main body 102, and connected to the external terminal 106. The external conductor 110 is a ground terminal maintained at a ground potential.

The connector 100b configured in such a way as described above is mounted on the front surface of the connection portion 12c so that the external terminal 104 is connected to an end portion of the signal line 20 on the positive direction side in the x-axis direction and the external terminal 106 is connected to the terminal conductor 23b. As a result, the signal line 20 is electrically connected to the center conductor 108. In addition, the ground conductor 25 is electrically connected to the external conductor 110.

In addition, in a planar view from the z-axis direction, the connector 100b overlaps with the conductor-missing portion Ob provided in the terminal conductor 25c of the ground conductor 25, as illustrated in FIG. 3. In this regard, however, it is not necessary for the connector 100b and the conductor-missing portion Ob to correspondingly overlap with each other in a planar view from the z-axis direction. Therefore, it is only necessary for the conductor-missing portion Ob to be provided because no conductor is provided in at least a portion of a region overlapping with the connector 100b, in a planar view from the z-axis direction. As illustrated in FIG. 3, in the high-frequency signal transmission line 10, the connector 100b protrudes out of the conductor-missing portion Ob in a planar view from the z-axis direction.

Figure 5A:
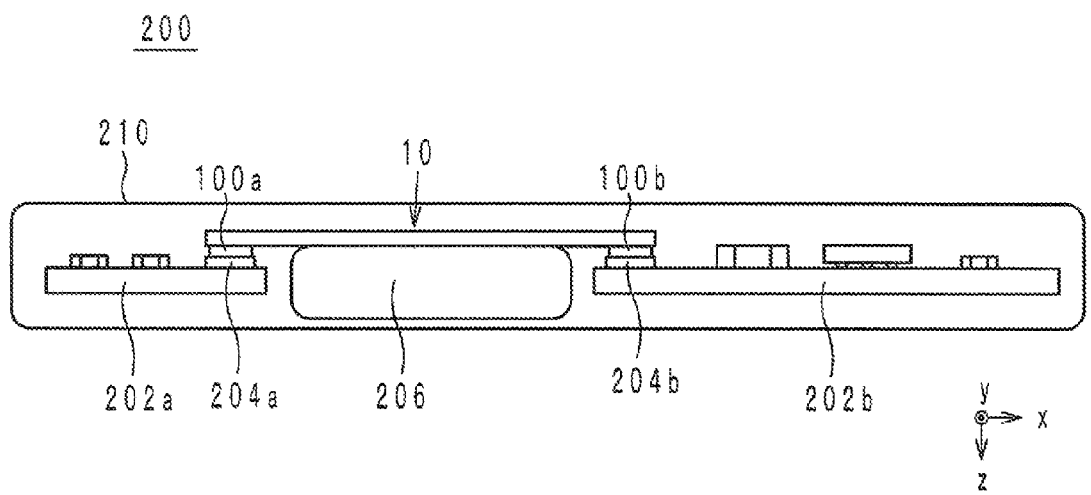
FIGS. 5A and 5B are diagrams of an electronic device in which a high-frequency signal transmission line is used, in a planar view from a y-axis direction and a z-axis direction.
Figure 5B:
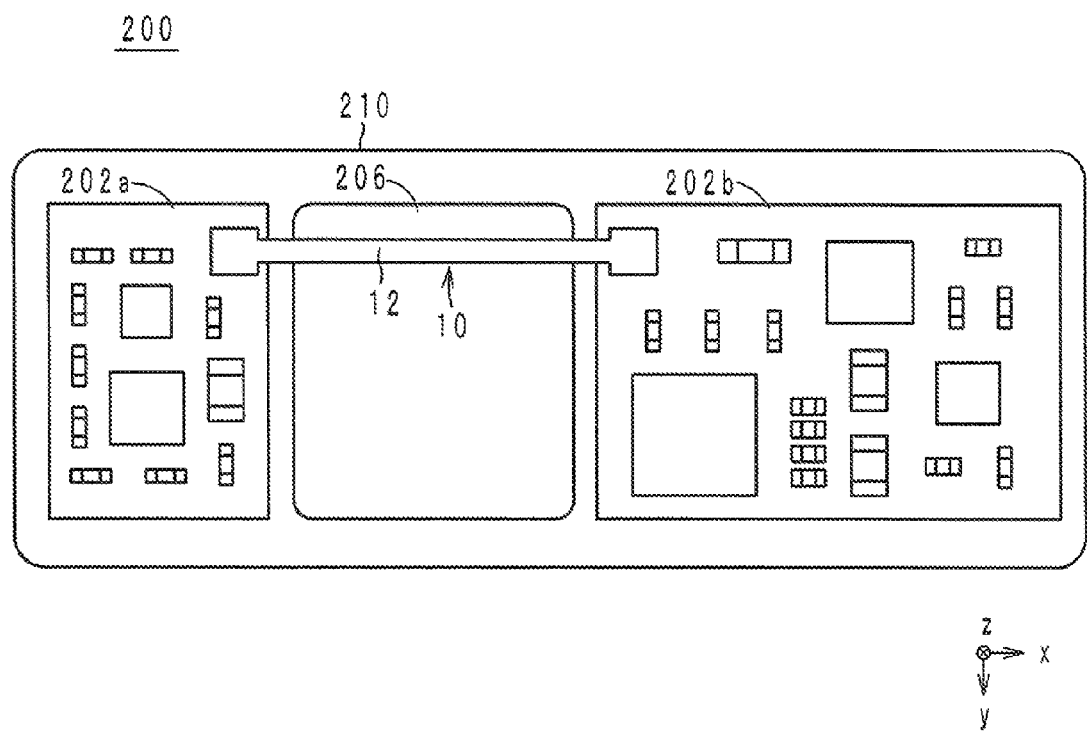

The high-frequency signal transmission line 10 is used in such a way as described below. FIGS. 5A and 5B are the diagrams of an electronic device 200 in which the high-frequency signal transmission line 10 is used, in a planar view from the y-axis direction and the z-axis direction.

The electronic device 200 includes the high-frequency signal transmission line 10, circuit substrates 202a and 202b, receptacles 204a and 204b, a battery pack (metallic body) 206, and a housing 210.

The housing 210 contains the high-frequency signal transmission line 10, the circuit substrates 202a and 202b, the receptacles 204a and 204b, and the battery pack (metallic body) 206. In the circuit substrate 202a, for example, a transmitting circuit or receiving circuit including an antenna is provided. In the circuit substrate 202b, for example, a feed circuit is provided. The battery pack 206 is, for example, a lithium-ion secondary battery, and has a structure in which the surface thereof is covered by a metal cover. The circuit substrate 202a, the battery pack 206, and the circuit substrate 202b are arranged in this order from the negative direction side to the positive direction side in the x-axis direction.

The receptacles 204a and 204b are provided on the main surfaces of the circuit substrates 202a and 202b on the negative direction side in the z-axis direction, respectively. The connectors 100a and 100b are connected to the receptacles 204a and 204b, respectively. In other words, through the front surface of the connection portion 12b, the signal line 20 and the circuit substrate 202a are electrically connected to each other. Through the front surface of the connection portion 12c, the signal line 20 and the circuit substrate 202b are electrically connected to each other. As a result, through the receptacles 204a and 204b, a high-frequency signal, which has the frequency of, for example, 2 GHz and is transmitted between the circuit substrates 202a and 202b, is applied to the center conductors 108 of the connectors 100a and 100b. In addition, through the circuit substrates 202a and 202b and the receptacles 204a and 204b, the external conductors 110 of the connectors 100a and 100b are maintained at a ground potential. As a result, the high-frequency signal transmission line 10 establishes electrical connection between the circuit substrates 202a and 202b.

Here, the front surface of the dielectric body 12 (more correctly, the protective layer 14) is in contact with the battery pack 206. In addition, the front surface of the dielectric body 12 and the battery pack 206 are fixed to each other by an adhesive or the like.

Hereinafter, a non-limiting example of a manufacturing method for the high-frequency signal transmission line 10 will be described with reference to FIG. 2. While, hereinafter, a case where one high-frequency signal transmission line 10 is manufactured will be cited as an example and described, actually large-sized dielectric sheets are laminated and cut, and hence, a plurality of high-frequency signal transmission lines 10 are simultaneously manufactured.

First, the dielectric sheet 18 made of a thermoplastic resin is prepared where copper foil is formed on the entire surface of the front surface thereof. The surface of the copper foil of the dielectric sheet 18 is smoothed by being subjected to, for example, zinc plating used for antirust. The thickness of the copper foil preferably ranges from about 10 μm to about 20 μm.

Next, using a photolithography process, the signal line 20 and the terminal conductors 23a and 23b, illustrated in FIG. 2, are formed on the front surface of the dielectric sheet 18a. Specifically, on the copper foil of the dielectric sheet 18a, resists are printed that have the same shapes as the signal line 20 and the terminal conductors 23a and 23b, illustrated in FIG. 2. In addition, by performing an etching processing on the copper foil, the copper foil of a portion not covered by the resist is removed. After that, the resist is removed. As a result, such a signal line 20 and terminal conductors 23a and 23b as illustrated in FIG. 2 are formed on the front surface of the dielectric sheet 18a.

Next, using a photolithography process, the ground conductor 25 illustrated in FIG. 2 is formed on the front surface of the dielectric sheet 18b. In addition, since the photolithography process here is preferably the same as the photolithography process in a case where the signal line 20 and the terminal conductors 23a and 23b are formed, the description thereof will be omitted.

Next, positions in which to form the via hole conductors b1 and b2 in the dielectric sheet 18a are subjected to a laser beam from the back surface side, and through holes are formed. After that, the through holes formed in the dielectric sheet 18a are filled with conductive pastes.

Next, the dielectric sheets 18a and 18b are stacked in this order from the positive direction side to the negative direction side in the z-axis direction. In addition, by applying heat and pressure to the dielectric sheets 18a and 18b from the positive direction side and the negative direction side in the z-axis direction, the dielectric sheets 18a and 18b are softened to be pressure-bonded and integrated and the conductive pastes with which the through holes have been filled are solidified to form the via hole conductors b1 and b2 illustrated in FIG. 2. In addition, the individual dielectric sheets 18 may also be integrated using an adhesive such as an epoxy based resin in place of the thermocompression bonding. In addition, through holes may also be formed after the dielectric sheets 18 have been integrated, and by filling the through holes with conductive pastes or forming plated films in the through holes, the via hole conductors b1 and b2 may also be formed. In addition, in the via hole conductors b1 and b2, it is not necessary for the through holes to be completely filled with conductors, and the via hole conductors b1 and b2 may also be formed by, for example, forming conductors only along the inner peripheral surfaces of the through holes.

Next, by applying a resin (resist) paste, the protective layer 14 is formed on the dielectric sheet 18a.

Finally, using an adhesive or the like, the adjustment plates 15a and 15b are stuck to the back surfaces of the connection portions 12b and 12c. As a result, the high-frequency signal transmission line 10 illustrated in FIGS. 1A and 1B is obtained.

Figure 6:
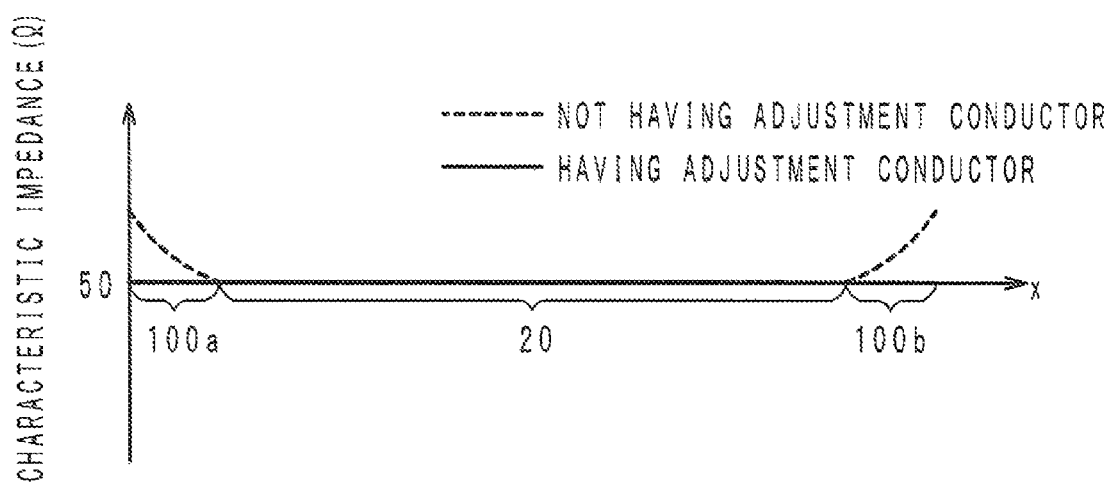
FIG. 6 is a graph illustrating a characteristic impedance of the high-frequency signal transmission line according to the first preferred embodiment of the present invention.
Figure 7:
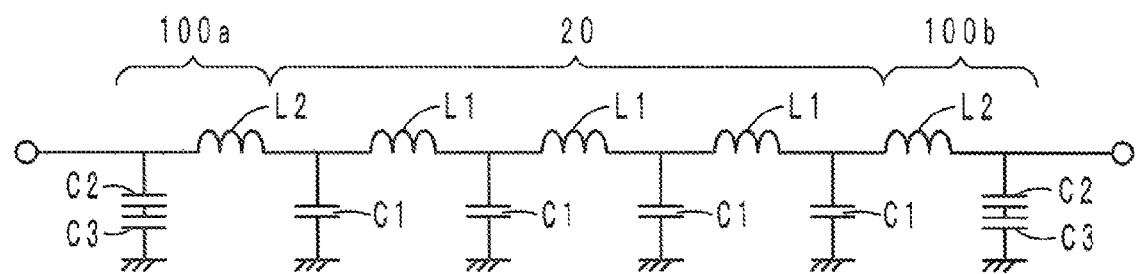
FIG. 7 is an equivalent circuit diagram of a high-frequency signal transmission line.
Figure 8:
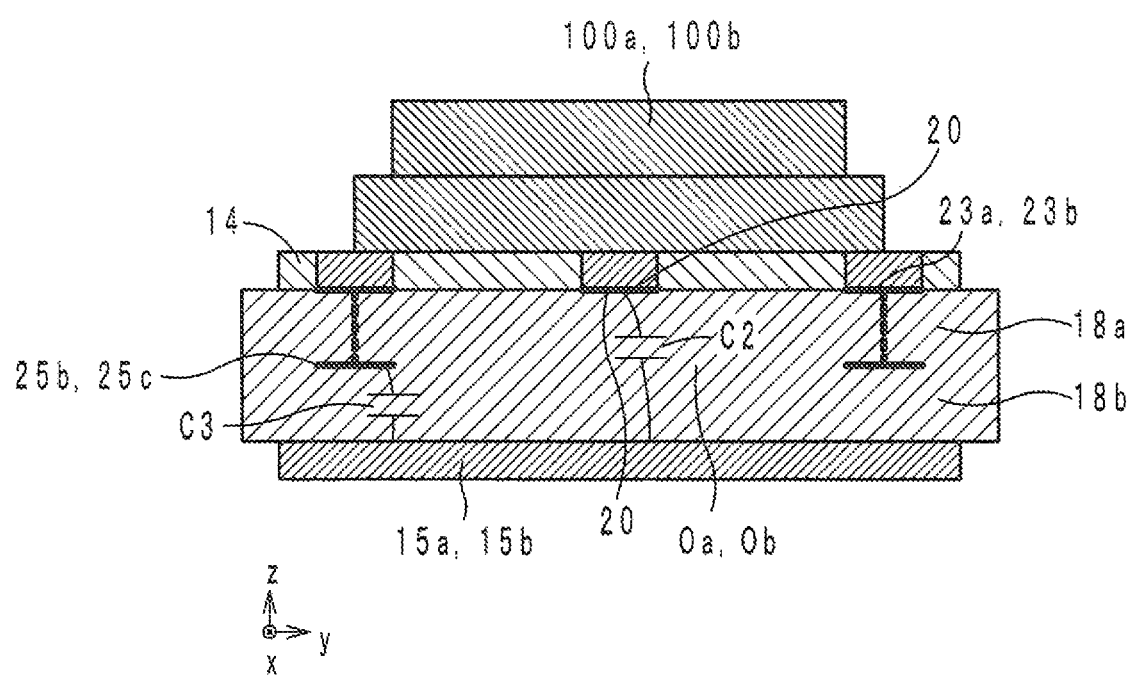
FIG. 8 is a cross-sectional structural view of a high-frequency signal transmission line.

According to the high-frequency signal transmission line 10 configured in such a way as described above, it is possible to significantly reduce or prevent the mismatching of characteristic impedances in the connectors 100a and 100b with respect to predetermined characteristic impedances. FIG. 6 is a graph illustrating the characteristic impedance of the high-frequency signal transmission line 10 according to the first preferred embodiment. A vertical axis indicates the characteristic impedance, and a horizontal axis indicates an x-axis. A solid line in FIG. 6 indicates the characteristic impedance of the high-frequency signal transmission line 10, and a dotted line in FIG. 6 indicates the characteristic impedance of a high-frequency signal transmission line according to a comparative example. In the high-frequency signal transmission line according to the comparative example, the adjustment plates 15a and 15b are not provided. FIG. 7 is the equivalent circuit diagram of the high-frequency signal transmission line 10. FIG. 8 is the cross-sectional structural view of the high-frequency signal transmission line 10.

In the high-frequency signal transmission line according to the comparative example, when the connectors 100a and 100b have been mounted on both end portions of the dielectric body 12, characteristic impedances in the connectors 100a and 100b are mismatched with respect to the predetermined characteristic impedance (e.g., about 50Ω). Here, the connectors 100a and 100b have been designed so that the characteristic impedances of the connectors 100a and 100b become slightly higher than the predetermined characteristic impedance.

Therefore, in the high-frequency signal transmission line 10, the adjustment plates 15a and 15b are individually provided on the back surface of the dielectric body 12, and overlap with at least portions of the conductor-missing portions Oa and Ob, respectively, in a planar view from the z-axis direction. As a result, as illustrated in FIG. 7 and FIG. 8, capacitances C2 turn out to be generated between the adjustment plates 15a and 15b and the end portions of the signal line 20. Furthermore, capacitances C3 turn out to be generated between the adjustment plates 15a and 15b and the terminal conductors 25b and 25c of the ground conductor 25. In other words, between the signal line 20 and the ground conductor 25, the capacitances C2 are C3 are connected in series.

Here, when the capacitances C2 and C3 have been connected in series, the combined capacitance Ct of the capacitances C2 and C3 becomes a minute value. Accordingly, the minute combined capacitances Ct are generated in the connectors 100a and 100b, and it becomes possible to slightly reduce the characteristic impedances of the connectors 100a and 100b. In other words, it is possible to finely adjust the characteristic impedances of the connectors 100a and 100b. As a result of the above features, in the high-frequency signal transmission line 10, by providing the conductor-missing portions Oa and Ob and the adjustment plates 15a and 15b, it is possible to match the characteristic impedances of the connectors 100a and 100b to the predetermined characteristic impedance with a high degree of accuracy.

In addition, in a case where the connectors 100a and 100b are attached to the receptacles 204a and 204b, forces are applied to the connection portions 12b and 12c. Therefore, there is a possibility that the connection portions 12b and 12c are greatly deformed and damaged. Therefore, in the high-frequency signal transmission line 10, the adjustment plates 15a and 15b are provided in the connection portions 12b and 12c, the adjustment plates 15a and 15b being more rigid than the dielectric body 12. As a result, the large deformations of the connection portions 12b and 12c are significantly reduced or prevented, and the damages of the connection portions 12b and 12c are significantly reduced or prevented.

Second Preferred Embodiment

Figure 9:
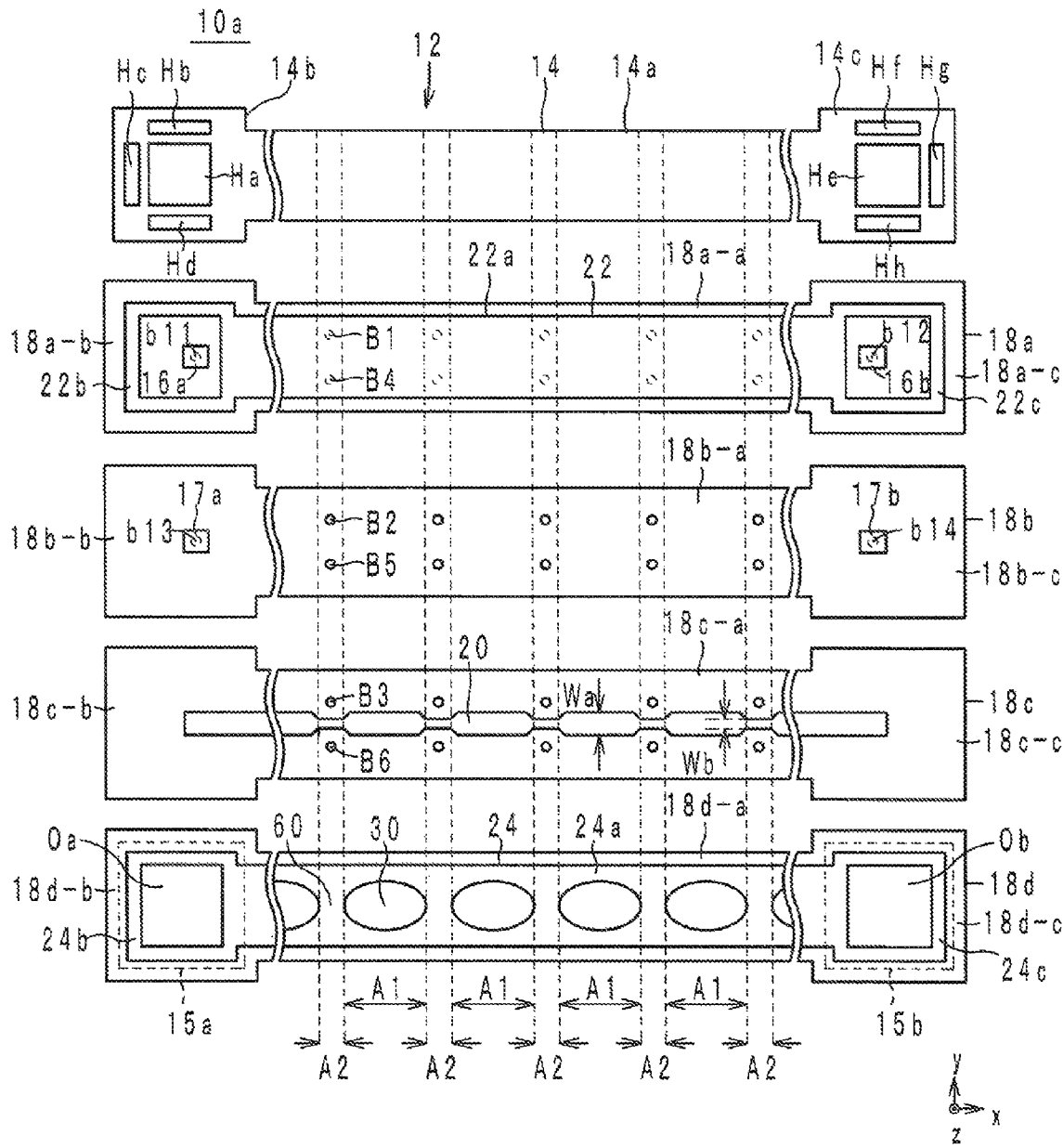
FIG. 9 is an exploded view of a dielectric body of a high-frequency signal transmission line according to a second preferred embodiment of the present invention.
Figure 10:
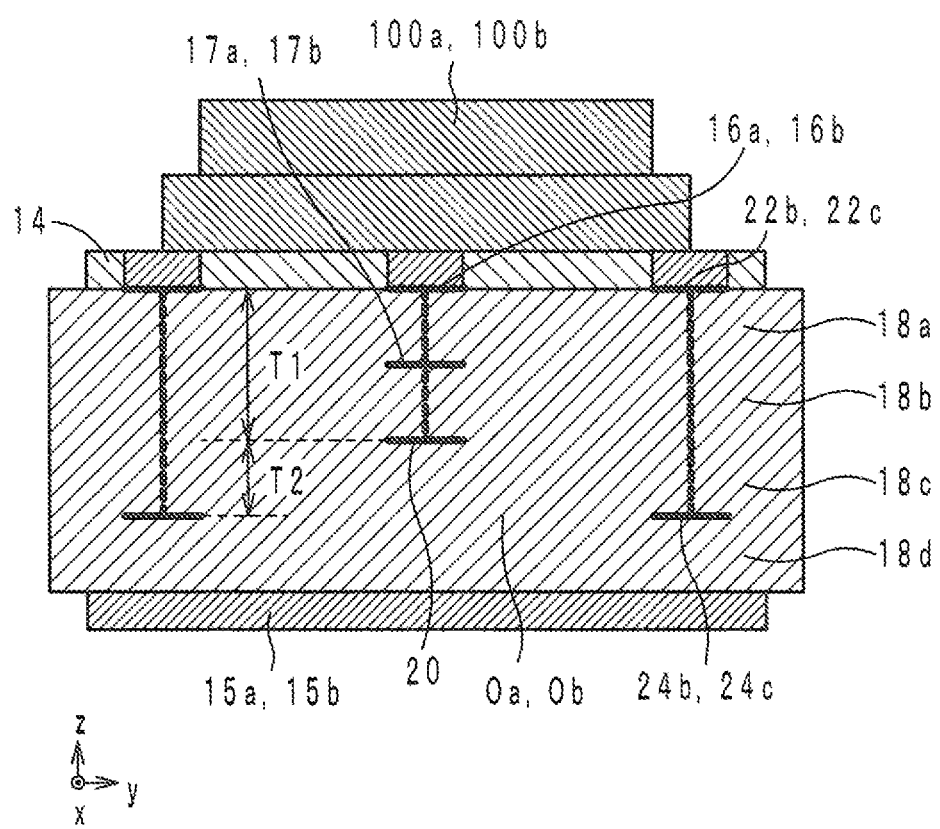
FIG. 10 is a cross-sectional structural view of the high-frequency signal transmission line according to the second preferred embodiment of the present invention.

Hereinafter, the configuration of a high-frequency signal transmission line according to a second preferred embodiment of the present invention will be described with reference to drawings. FIG. 9 is an exploded view of the dielectric body 12 of a high-frequency signal transmission line 10a according to the second preferred embodiment. FIG. 10 is a cross-sectional structural view of the high-frequency signal transmission line 10a according to the second preferred embodiment. In addition, as for the appearance perspective view of the high-frequency signal transmission line 10a, FIGS. 1A and 1B are incorporated.

As illustrated in FIGS. 1A and 1B and FIG. 9, the high-frequency signal transmission line 10a includes the dielectric body 12, external terminals 16 (16a and 16b), connection conductors 17 (17a and 17b), a signal line 20, ground conductors 22 and 24, via hole conductors b11 to b14 and B1 to B6, and connectors 100a and 100b.

In a planar view from the z-axis direction, the dielectric body 12 extends in the x-axis direction, and includes a line portion 12a and connection portions 12b and 12c. The dielectric body 12 is a laminated body configured by a protective layer 14 and dielectric sheets (insulator layers) 18 (18a to 18d), illustrated in FIG. 2, being laminated in this order from the positive direction side in the z-axis direction to the negative direction side therein. In what follows, the main surface of the dielectric body 12 on a positive direction side in the z-axis direction is referred to as a front surface, and the main surface of the dielectric body 12 on a negative direction side in the z-axis direction is referred to as a back surface.

The line portion 12a extends in the x-axis direction. The connection portions 12b and 12c are connected to an end portion of the line portion 12a on a negative direction side in the x-axis direction and an end portion of the line portion 12a on a positive direction side in the x-axis direction, respectively, and have respective rectangular or substantially rectangular shapes. The widths of the connection portions 12b and 12c in the y-axis direction are wider than the width of the line portion 12a in the y-axis direction.

The dielectric sheet 18 extends in the x-axis direction, and preferably has the same or substantially the same shape as the dielectric body 12 in a planar view from the z-axis direction. The dielectric sheet 18 is configured by a thermoplastic resin having flexibility, such as polyimide or liquid crystalline polymer. The thickness of the dielectric sheet 18 after lamination preferably ranges, for example, from about 50 μm to about 200 μm. Hereinafter, the main surface of the dielectric sheet 18 on the positive direction side in the z-axis direction is referred to as a front surface, and the main surface of the dielectric sheet 18 on the negative direction side in the z-axis direction is referred to as a back surface.

In addition, the dielectric sheet 18a includes a line portion 18a-a and connection portions 18a-b and 18a-c. The dielectric sheet 18b includes a line portion 18b-a and connection portions 18b-b and 18b-c. The dielectric sheet 18c includes a line portion 18c-a and connection portions 18c-b and 18c-c. The dielectric sheet 18d includes a line portion 18d-a and connection portions 18d-b and 18d-c. The line portions 18a-a, 18b-a, 18c-a, and 18d-a configure the line portion 12a. The connection portions 18a-b, 18b-b, 18c-b, and 18d-b configure the connection portion 12b. The connection portions 18a-c, 18b-c, 18c-c, and 18d-c configure the connection portion 12c.

As illustrated in FIGS. 1A and 1B and FIG. 9, the external terminal 16a is a rectangular or substantially rectangular conductor provided on the vicinity of the center of the front surface of the connection portion 18a-b. As illustrated in FIGS. 1A and 1B and FIG. 9, the external terminal 16b is a rectangular or substantially rectangular conductor provided on the vicinity of the center of the front surface of the connection portion 18a-c. The external terminals 16a and 16b are manufactured using metal materials whose specific resistances are small and whose main components are silver or copper. In addition, the surfaces of the external terminals 16a and 16b preferably are gold-plated.

As illustrated in FIGS. 1A and 1B and FIG. 9, the connection conductor 17a is a rectangular or substantially rectangular conductor provided on the vicinity of the center of the front surface of the connection portion 18b-b, and overlaps with the external terminal 16a in a planar view from the z-axis direction. As illustrated in FIGS. 1A and 1B and FIG. 9, the connection conductor 17b is a rectangular or substantially rectangular conductor provided on the vicinity of the center of the front surface of the connection portion 18b-c, and overlaps with the external terminal 16b in a planar view from the z-axis direction. The connection conductors 17a and 17b are manufactured using metal materials whose specific resistances are small and whose main components are silver or copper.

As illustrated in FIG. 9, the signal line 20 is a linear conductor provided within the dielectric body 12 and extends on the front surface of the dielectric sheet 18c in the x-axis direction. Both the respective end portions of the signal line 20 overlap with the external terminals 16a and 16b and the connection conductors 17a and 17b in a planar view from the z-axis direction. The signal line 20 is manufactured using a metal material whose specific resistance is small and whose main component is silver or copper.

As illustrated in FIG. 9, the ground conductor 22 (a second ground conductor) is provided within the dielectric body 12 on the positive direction side in the z-axis direction, compared with the signal line 20 (in other words, on the front surface side of the dielectric body 12), and in more detail, provided on the front surface of the dielectric sheet 18a. The ground conductor 22 extends in the x-axis direction along the signal line 20 on the front surface of the dielectric sheet 18a, and faces the signal line 20 across the dielectric sheets 18a and 18b, as illustrated in FIG. 9.

In addition, the ground conductor 22 includes a main conductor 22a and terminal conductors 22b and 22c. The main conductor 22a is provided on the front surface of the line portion 18a-a, and extends in the x-axis direction. In the main conductor 22a, practically no opening is provided. In other words, the main conductor 22a is an electrode continuously extending along the signal line 20 in the line portion 12a in the x-axis direction, namely, a so-called flat plate-shaped electrode. In this regard, however, it is not necessary for the main conductor 22a to completely cover the line portion 12a, and for example, a small hole or the like may also be provided in a predetermined position in the main conductor 22a so as to allow gas to escape, the gas occurring when the thermoplastic resin of the dielectric sheet 18 is subjected to thermocompression bonding. The main conductor 22a is manufactured using a metal material whose specific resistance is small and whose main component is silver or copper.

The terminal conductor 22b is provided on the front surface of the connection portion 18a-b, and defines a rectangular or substantially rectangular ring surrounding the circumference of the external terminal 16a. The terminal conductor 22b is connected to an end portion of the main conductor 22a on the negative direction side in the x-axis direction. The terminal conductor 22c is provided on the front surface of the connection portion 18a-c, and has a ring-shaped rectangular or substantially rectangular shape surrounding the circumference of the external terminal 16b. The terminal conductor 22c is connected to an end portion of the main conductor 22a on the positive direction side in the x-axis direction.

Here, the characteristic impedance of the high-frequency signal transmission line 10a is defined mainly on the basis of a facing area and a distance between the signal line 20 and the ground conductor 22 and the relative permittivities of the dielectric sheets 18a to 18d. Therefore, in a case where the characteristic impedance of the high-frequency signal transmission line 10a is set to 50Ω, for example, designing is performed, for example, so that the characteristic impedance of the high-frequency signal transmission line 10a becomes 55Ω, for example, because of the signal line 20 and the ground conductor 22, the 55Ω being slightly higher than 50Ω. In addition, the shape of the after-mentioned ground conductor 24 is adjusted so that the characteristic impedance of the high-frequency signal transmission line 10a becomes 50Ω because of the signal line 20, the ground conductor 22, and the after-mentioned ground conductor 24. As described above, the ground conductor 22 functions as a reference-ground electrode.

As illustrated in FIG. 9, the ground conductor 24 (a first ground conductor) is provided within the dielectric body 12 on the negative direction side in the z-axis direction, compared with the signal line 20 (in other words, on the back surface side of the dielectric body 12), and in more detail, provided on the front surface of the dielectric sheet 18d. The ground conductor 24 extends in the x-axis direction along the signal line 20 on the front surface of the dielectric sheet 18d, and faces the signal line 20 across the dielectric sheet 18c, as illustrated in FIG. 9. The ground conductor 24 is manufactured using a metal material whose specific resistance is small and whose main component is silver or copper.

In addition, the ground conductor 24 includes a line conductor 24a and terminal conductors 24b and 24c. The line conductor 24a is provided on the front surface of the line portion 18d-a, and extends in the x-axis direction. In addition, a plurality of openings 30 in which no conductor layers are formed and a plurality of bridge portions 60 serving as portions in which conductor layers are formed are alternately provided along the signal line 20, and hence, the line conductor 24a has a ladder shape. As illustrated in FIG. 9, in a planar view from the z-axis direction, the opening 30 has an elliptical or substantially elliptical shape having a longitudinal direction in the x-axis direction, and overlaps with the signal line 20. As a result, in a planar view from the z-axis direction, the signal line 20 alternately overlaps with the openings 30 and the bridge portions 60. In addition, the openings 30 are arranged at equal intervals.

The terminal conductor 24b is provided on the front surface of the connection portion 18d-b, and defines a rectangular or substantially rectangular ring surrounding the center of the connection portion 18d-b. As a result, in the ground conductor 24, a conductor-missing portion Oa is provided in a region surrounded by the terminal conductor 24b. In addition, an end portion of the signal line 20 on the negative direction side in the x-axis direction is located within the conductor-missing portion Oa in a planar view from the z-axis direction. The terminal conductor 24b is connected to an end portion of the line conductor 24a on the negative direction side in the x-axis direction.

The terminal conductor 24c is provided on the front surface of the connection portion 18d-c, and defines a rectangular or substantially rectangular ring surrounding the center of the connection portion 18d-c. As a result, in the ground conductor 24, a conductor-missing portion Ob is provided in a region surrounded by the terminal conductor 24c. In addition, an end portion of the signal line 20 on the positive direction side in the x-axis direction is located within the conductor-missing portion Ob in a planar view from the z-axis direction. The terminal conductor 24c is connected to an end portion of the line conductor 24a on the positive direction side in the x-axis direction.

The ground conductor 24 is an auxiliary ground conductor also functioning as a shield. In addition, as described above, the ground conductor 24 is designed in order to make a final adjustment so that the characteristic impedance of the high-frequency signal transmission line 10a becomes about 50Ω, for example. Specifically, the size of the opening 30, the line width of the bridge portion 60, and so forth are designed.

As described above, no opening is provided in the ground conductor 22, and the openings 30 are provided in the ground conductor 24. Accordingly, an area where the ground conductor 24 and the signal line 20 face each other is smaller than an area where the ground conductor 22 and the signal line 20 face each other.

Here, as illustrated in FIG. 9, in the high-frequency signal transmission line 10a, a region where the opening 30 is provided is referred to as a region A1, and a region where the bridge portion 60 is provided is referred to as a region A2. In other words, the signal line 20 overlaps with the opening 30 in the region A1, and the signal line 20 overlaps with the bridge portion 60 and does not overlap with the opening 30, in the region A2. The regions A1 and the regions A2 are alternately arranged in the x-axis direction.

In addition, as illustrated in FIG. 9, the line width Wa of the signal line 20 in the region A1 is larger than the line width Wb of the signal line 20 in the region A2. Since the signal line 20 does not overlap with the ground conductor 24 in the region A1, it is possible to reduce the high-frequency resistance value of the signal line by enlarging the line width Wa. On the other hand, since the signal line 20 overlaps with the ground conductor 24 in the region A2, the line width Wb is set to be smaller than the region A1 so as to suppress the reduction of the high-frequency resistance value.

The via hole conductor b11 penetrates the connection portion 18a-b of the dielectric sheet 18a in the z-axis direction, and connects the external terminal 16a and the connection conductor 17a to each other. The via hole conductor b13 penetrates the connection portion 18b-b of the dielectric sheet 18b in the z-axis direction, and connects the connection conductor 17a and an end portion of the signal line 20 on the negative direction side in the x-axis direction to each other. As a result, an end portion of the signal line 20 on the negative direction side in the x-axis direction is connected to the external terminal 16a.

The via hole conductor b12 penetrates the connection portion 18a-c of the dielectric sheet 18a in the z-axis direction, and connects the external terminal 16b and the connection conductor 17b to each other. The via hole conductor b14 penetrates the connection portion 18b-c of the dielectric sheet 18b in the z-axis direction, and connects the connection conductor 17b and an end portion of the signal line 20 on the positive direction side in the x-axis direction to each other. As a result, an end portion of the signal line 20 on the positive direction side in the x-axis direction is connected to the external terminal 16b. The via hole conductors b11 to b14 are manufactured using metal materials whose specific resistances are small and whose main components are silver or copper.

The plural via hole conductors B1 to B3 penetrate the line portions 18a-a, 18b-a, and 18c-a of the dielectric sheets 18a, 18b, and 18c in the z-axis direction and are laid out in lines in the line portions 18a-a, 18b-a, and 18c-a at equal intervals, respectively. In a planar view from the z-axis direction, the via hole conductors B1 to B3 are provided on a positive direction side in the y-axis direction, compared with the signal line 20. In addition, the via hole conductors B1 to B3 configure one via hole conductor by being connected to each other, and connect the ground conductor 22 and the ground conductor 24 to each other. The via hole conductors B1 to B3 are manufactured using metal materials whose specific resistances are small and whose main components are silver or copper.

The plural via hole conductors B4 to B6 penetrate the line portions 18a-a, 18b-a, and 18c-a of the dielectric sheets 18a, 18b, and 18c in the z-axis direction and are laid out in lines in the line portions 18a-a, 18b-a, and 18c-a at equal intervals, respectively. In a planar view from the z-axis direction, the via hole conductors B4 to B6 are provided on a negative direction side in the y-axis direction, compared with the signal line 20. In addition, the via hole conductors B4 to B6 configure one via hole conductor by being connected to each other, and connect the ground conductor 22 and the ground conductor 24 to each other. The via hole conductor B4 to B6 are manufactured using metal materials whose specific resistances are small and whose main components are silver or copper.

As described above, the signal line 20 and the ground conductors 22 and 24 define a triplate-type strip line structure. In addition, as illustrated in FIG. 10, an interval between the signal line 20 and the ground conductor 22 is approximately equal to the thickness T1 of the sum of the dielectric sheets 18a and 18b, and preferably ranges, for example, from about 50 µm to about 300 µm. In the present preferred embodiment, the interval between the signal line 20 and the ground conductor 22 preferably is about 150 µm, for example. On the other hand, as illustrated in FIG. 10, an interval between the signal line 20 and the ground conductor 24 is approximately equal to the thickness T2 of the dielectric sheet 18c, and ranges, for example, from about 10 µm to about 100 µm. In the present preferred embodiment, the interval between the signal line 20 and the ground conductor 24 preferably is about 50 µm, for example. In other words, the thickness T1 is designed so as to be larger than the thickness T2.

The protective layer 14 covers substantially the entire surface of the front surface of the dielectric sheet 18a. As a result, the protective layer 14 covers the ground conductor 22. The protective layer 14 is made of, for example, a flexible resin such as a resist material.

In addition, as illustrated in FIG. 9, the protective layer 14 includes a line portion 14a and connection portions 14b and 14c. The line portion 14a covers the main conductor 22a by covering the entire surface of the front surface of the line portion 18a-a.

The connection portion 14b is connected to an end portion of the line portion 14a on the negative direction side in the x-axis direction, and covers the front surface of the connection portion 18a-b. In this regard, however, in the connection portion 14b, openings Ha to Hd are provided. The opening Ha is a rectangular or substantially rectangular opening provided at substantially the center of the connection portion 14b. The external terminal 16a is exposed to the outside through the opening Ha. In addition, the opening Hb is a rectangular or substantially rectangular opening provided on the positive direction side of the opening Ha in the y-axis direction. The opening Hc is a rectangular or substantially rectangular opening provided on the negative direction side of the opening Ha in the x-axis direction. The opening Hd is a rectangular or substantially rectangular opening provided on the negative direction side of the opening Ha in the y-axis direction. The terminal conductor 22b is exposed to the outside through the openings Hb to Hd, and hence, functions as an external terminal.

The connection portion 14c is connected to an end portion of the line portion 14a on the positive direction side in the x-axis direction, and covers the front surface of the connection portion 18a-c. In this regard, however, in the connection portion 14c, openings He to Hh are provided. The opening He is a rectangular or substantially rectangular opening provided at substantially the center of the connection portion 14c. The external terminal 16b is exposed to the outside through the opening He. In addition, the opening Hf is a rectangular or substantially rectangular opening provided on the positive direction side of the opening He in the y-axis direction. The opening Hg is a rectangular or substantially rectangular opening provided on the positive direction side of the opening He in the x-axis direction. The opening Hh is a rectangular or substantially rectangular opening provided on the negative direction side of the opening He in the y-axis direction. The terminal conductor 22c is exposed to the outside through the openings Hf to Hh, and hence, functions as an external terminal.

The adjustment plate 15a is provided on the back surface of the connection portion 12b of the dielectric body 12, and a rectangular or substantially rectangular metal plate overlapping with at least a portion of the conductor-missing portion Oa in a planar view from the z-axis direction. Furthermore, the adjustment plate 15a is not electrically connected to any one of the signal line 20 and the ground conductors 22 and 24. In more detail, the adjustment plate 15a overlaps with the whole of the conductor-missing portion Oa in a planar view from the z-axis direction, and hence, overlaps with an end portion of the signal line 20 on the negative direction side in the x-axis direction. As a result, capacitance is generated between the adjustment plate 15a and an end portion of the signal line 20 on the negative direction side in the x-axis direction. Furthermore, the adjustment plate 15a protrudes out of the conductor-missing portion Oa, and hence, overlaps with the terminal conductor 24b of the ground conductor 24. As a result, capacitance is generated between the adjustment plate 15a and the terminal conductor 24b of the ground conductor 24.

The adjustment plate 15b is provided on the back surface of the connection portion 12c of the dielectric body 12, and a rectangular or substantially rectangular metal plate overlapping with at least a portion of the conductor-missing portion Ob in a planar view from the z-axis direction. Furthermore, the adjustment plate 15b is not electrically connected to any one of the signal line 20 and the ground conductors 22 and 24. In more detail, the adjustment plate 15b overlaps with the whole of the conductor-missing portion Ob in a planar view from the z-axis direction, and hence, overlaps with an end portion of the signal line 20 on the positive direction side in the x-axis direction. As a result, capacitance is generated between the adjustment plate 15b and an end portion of the signal line 20 on the positive direction side in the x-axis direction. Furthermore, the adjustment plate 15b protrudes out of the conductor-missing portion Ob, and hence, overlaps with the terminal conductor 24c of the ground conductor 24. As a result, capacitance is generated between the adjustment plate 15b and the terminal conductor 24c of the ground conductor 24.

In addition, since the configurations of the connectors 100a and 100b in the high-frequency signal transmission line 10a are the same as the configurations of the connectors 100a and 100b in the high-frequency signal transmission line 10, the description thereof will be omitted.

Figure 11:
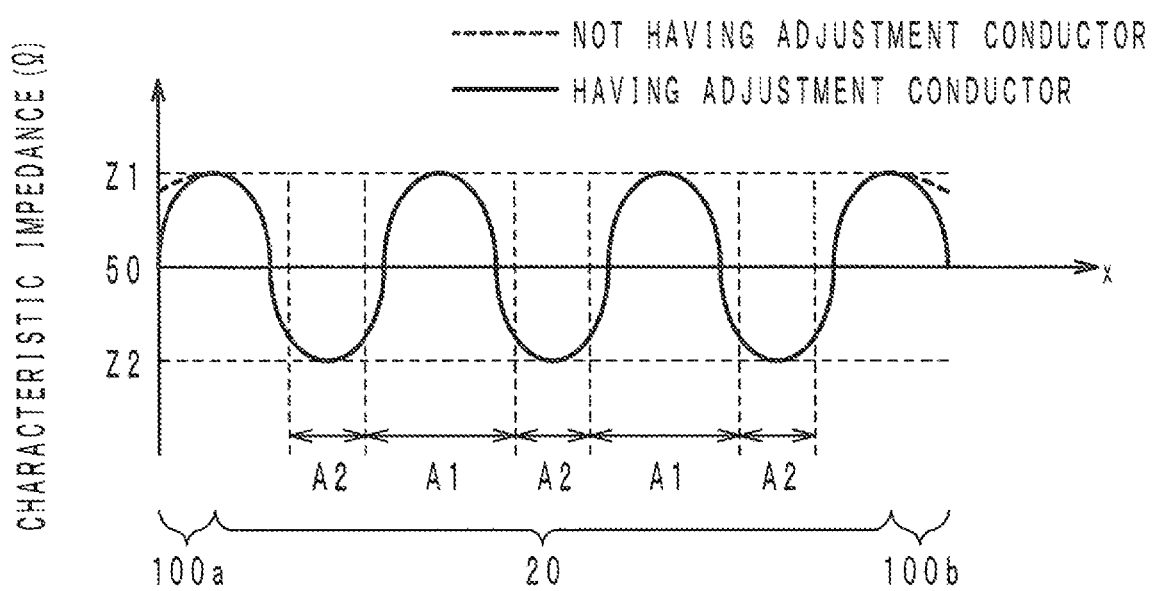
FIG. 11 is a graph illustrating a characteristic impedance of the high-frequency signal transmission line according to the second preferred embodiment of the present invention.

According to the high-frequency signal transmission line 10a configured in such a way as described above, it is possible to significantly reduce or prevent the mismatching of characteristic impedances in the connectors 100a and 100b with respect to predetermined characteristic impedances, in the same way as the high-frequency signal transmission line 10. FIG. 11 is a graph illustrating the characteristic impedance of the high-frequency signal transmission line 10a according to the second preferred embodiment. A vertical axis indicates the characteristic impedance, and a horizontal axis indicates an x-axis. A solid line in FIG. 11 indicates the characteristic impedance of the high-frequency signal transmission line 10a, and a dotted line in FIG. 11 indicates the characteristic impedance of a high-frequency signal transmission line according to a comparative example. In the high-frequency signal transmission line according to the comparative example, the adjustment plates 15a and 15b are not provided.

As illustrated in FIG. 11, in the high-frequency signal transmission line 10a, in the same way as the high-frequency signal transmission line 10, the connectors 100a and 100b have been designed so that the characteristic impedances of the connectors 100a and 100b become slightly higher than a predetermined characteristic impedance. In addition, the conductor-missing portions Oa and Ob and the adjustment plates 15a and 15b are provided, and hence, the characteristic impedances of the connectors 100a and 100b are slightly reduced. As a result, in the high-frequency signal transmission line 10a, it is possible to match the characteristic impedances of the connectors 100a and 100b to the predetermined characteristic impedance with a high degree of accuracy.

In addition, in the high-frequency signal transmission line 10a, the characteristic impedance of the signal line 20 in the region A1 is higher than the characteristic impedance of the signal line in the region A2. In more detail, as described below, the characteristic impedance of the signal line 20 fluctuates in such a manner that, between the two adjacent bridge portions 60, the characteristic impedance of the signal line 20 decreases from a maximum value Z1 to a minimum value Z2 after increasing from the minimum value Z2 to the maximum value Z1, with coming close from one bridge portion 60 to the other bridge portion 60.

The width of the opening 30 in the y-axis direction is maximized in the center of the region A1 in the x-axis direction, and decreases with coming close to both end portions of the region A1 in the x-axis direction. Therefore, a distance between the signal line 20 and the ground conductor 24 in the region A1 is maximized in the center of the region A1 in the x-axis direction, and decreases with coming close to both end portions of the region A1 in the x-axis direction. As a result, the intensity of a magnetic field occurring in the signal line 20 in the center of the region A1 in the x-axis direction becomes larger than the intensities of magnetic fields occurring in the signal line 20 in both end portions of the region A1 in the x-axis direction. In other words, an inductance component in the center of the region A1 in the x-axis direction becomes large. In other words, an L property becomes dominant in the center of the region A1 in the x-axis direction.

On the other hand, the bridge portion 60 is provided in the region A2. Therefore, a distance between the signal line 20 and the ground conductor 24 in the region A2 is smaller than the distance between the signal line 20 and the ground conductor 24 in the region A1. As a result, in addition to it that capacitance occurring in the signal line 20 in the region A2 becomes larger than capacitance occurring in the signal line 20 in the region A1, a magnetic field intensity in the region A2 becomes smaller than a magnetic field intensity in the region A1. In other words, a C property becomes dominant in the region A2.

As a result of the above, since capacitance rarely occurs between the signal line 20 and the ground conductor 24 in the center of the region A1 in the x-axis direction, the maximum value Z1 occurs due mainly to the inductance of the signal line 20. In addition, in the region A2, since large capacitance has occurred between the signal line 20 and the ground conductor 24, the minimum value Z2 occurs due mainly to the capacitance. As a result, as illustrated in FIG. 11, the characteristic impedance of the signal line 20 periodically fluctuates between the maximum value Z1 and the minimum value Z2. The maximum value Z1 preferably is, for example, about 70Ω. The minimum value Z2 preferably is, for example, about 30Ω. In this regard, however, the characteristic impedance of the signal line 20 in the region A1 and the characteristic impedance in the region A2 are designed so that the characteristic impedance of the whole signal line 20 becomes a predetermined characteristic impedance (for example, about 50Ω).

In addition, according to the high-frequency signal transmission line 10a, it is possible to reduce a transmission loss associated with the stabilization of a ground potential in the ground conductor 24, and it is possible to improve a shielding characteristic. In more detail, in the high-frequency signal transmission line 10a, the width of the opening 30 in the center of the region A1 in the x-axis direction is wider than the widths of the opening 30 in both end portions of the region A1 in the x-axis direction. As a result, in the high-frequency signal transmission line 10a, the magnetic field energy of the signal line 20 located in the center of the region A1 in the x-axis direction becomes higher than the magnetic field energies of the signal line 20 located in both end portions of the region A1 in the x-axis direction. In addition, the magnetic field energy of the signal line 20 located in the region A2 becomes lower than the magnetic field energies of the signal line 20 located in both end portions of the region A1 in the x-axis direction. Accordingly, as illustrated in FIG. 11, the characteristic impedance of the signal line 20 turns out to repeatedly fluctuate in the order of Z2, Z1, Z2, . . . . Accordingly, in the signal line 20, the fluctuation of a magnetic field energy in portions adjacent to each other in the x-axis direction becomes moderate. As a result, a magnetic field energy becomes small in a boundary between the regions A1 and A2, the fluctuation of the ground potential of the ground conductor is significantly reduced or prevented, and the occurrence of unnecessary radiation and the transmission loss of a high-frequency signal is significantly reduced or prevented.

Furthermore, in the high-frequency signal transmission line 10a, in a case of being disposed in an electronic device such as the electronic device 200 illustrated in FIGS. 5A and 5B, the flat plate-shaped ground conductor 22 is disposed on a battery pack 206 side, compared with the signal line 20. Therefore, it is possible to significantly reduced or prevented electrical interference from the battery pack 206 side to the signal line 20. Accordingly, it is possible to obtain a high-frequency signal transmission line whose transmission loss is small even if a metal member such as the battery pack 206 is near.

Third Preferred Embodiment

Figure 12:
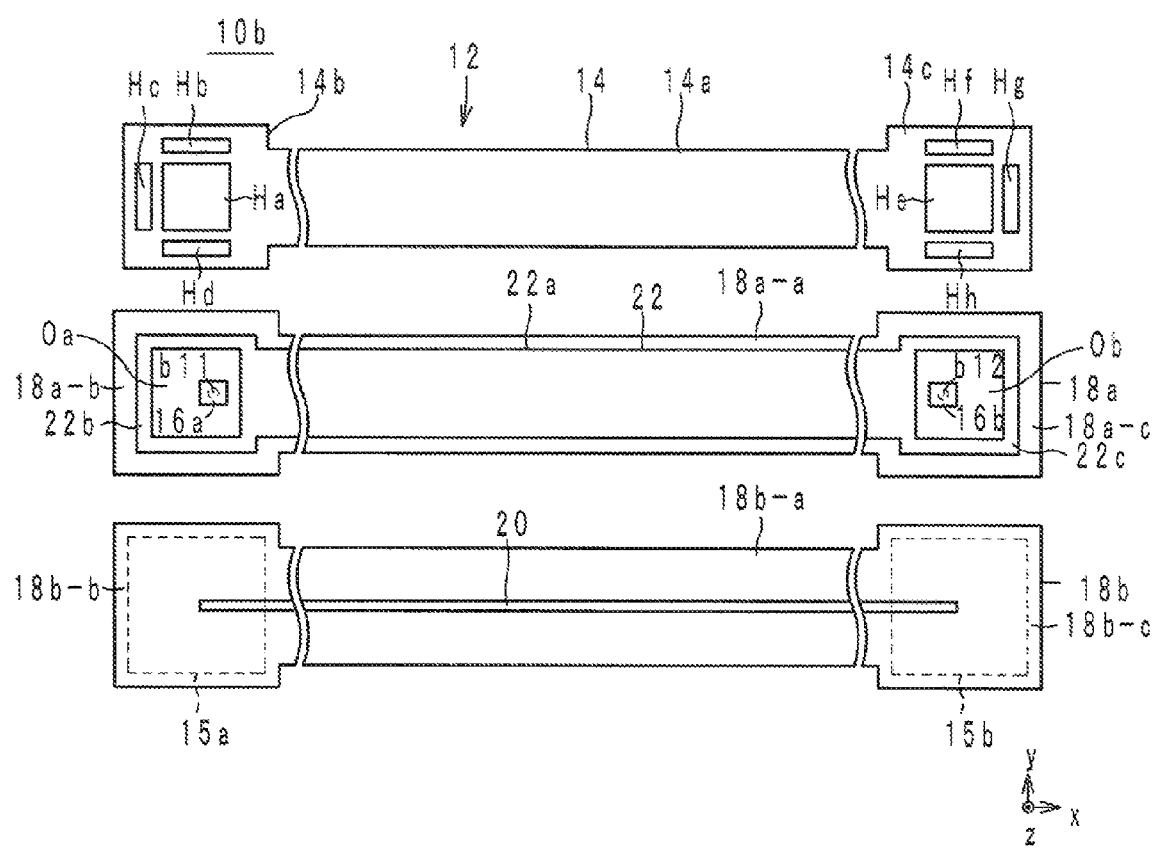
FIG. 12 is an exploded view of a dielectric body of a high-frequency signal transmission line according to a third preferred embodiment of the present invention.

Hereinafter, the configuration of a high-frequency signal transmission line according to a third preferred embodiment of the present invention will be described with reference to drawings. FIG. 12 is an exploded view of the dielectric body 12 of a high-frequency signal transmission line 10b according to the third preferred embodiment. In addition, as for the appearance perspective view of the high-frequency signal transmission line 10b, FIGS. 1A and 1B are incorporated.

The high-frequency signal transmission line 10b is different from the high-frequency signal transmission line 10a mainly in that the ground conductor 24 is not provided. Hereinafter, the high-frequency signal transmission line 10b will be described in detail with a focus on such a difference.

As illustrated in FIGS. 1A and 1B and FIG. 12, the external terminal 16a is a rectangular or substantially rectangular conductor provided on the vicinity of the center of the front surface of the connection portion 18a-b. As illustrated in FIGS. 1A and 1B and FIG. 12, the external terminal 16b is a rectangular or substantially rectangular conductor provided on the vicinity of the center of the front surface of the connection portion 18a-c. The external terminals 16a and 16b are manufactured using metal materials whose specific resistances are small and whose main components are silver or copper. In addition, the surfaces of the external terminals 16a and 16b preferably are gold-plated.

As illustrated in FIG. 12, the signal line 20 is a linear conductor provided within the dielectric body 12 and extends on the front surface of the dielectric sheet 18b in the x-axis direction. The line width of the signal line 20 remains steady. Both the respective end portions of the signal line 20 overlap with the external terminals 16a and 16b in a planar view from the z-axis direction. The signal line 20 is manufactured using a metal material whose specific resistance is small and whose main component is silver or copper.

The via hole conductor b11 penetrates the connection portion 18a-b of the dielectric sheet 18a in the z-axis direction, and connects the external terminal 16a and an end portion of the signal line 20 on the negative direction side in the x-axis direction to each other. The via hole conductor b12 penetrates the connection portion 18a-c of the dielectric sheet 18a in the z-axis direction, and connects the external terminal 16b and an end portion of the signal line 20 on the positive direction side in the x-axis direction to each other. The via hole conductors b11 and b12 are manufactured using metal materials whose specific resistances are small and whose main components are silver or copper.

As illustrated in FIG. 12, the ground conductor 22 (a first ground conductor) is provided within the dielectric body 12 on the positive direction side in the z-axis direction, compared with the signal line 20 (in other words, on the front surface side of the dielectric body 12), and in more detail, provided on the front surface of the dielectric sheet 18a. The ground conductor 22 extends in the x-axis direction along the signal line 20 on the front surface of the dielectric sheet 18a, and faces the signal line 20 across the dielectric sheets 18a and 18b, as illustrated in FIG. 12.

In addition, the ground conductor 22 includes a main conductor 22a and terminal conductors 22b and 22c. The main conductor 22a is provided on the front surface of the line portion 18a-a, and extends in the x-axis direction. In the main conductor 22a, practically no opening is provided. In other words, the main conductor 22a is an electrode continuously extending along the signal line 20 in the line portion 12a in the x-axis direction, namely, a so-called flat plate-shaped electrode. In this regard, however, it is not necessary for the main conductor 22a to completely cover the line portion 12a, and for example, a small hole or the like may also be provided in a predetermined position in the main conductor 22a so as to allow gas to escape, the gas occurring when the thermoplastic resin of the dielectric sheet 18 is subjected to thermocompression bonding. The main conductor 22a is manufactured using a metal material whose specific resistance is small and whose main component is silver or copper.

The terminal conductor 22b is provided on the front surface of the connection portion 18a-b, and defines a rectangular or substantially rectangular ring surrounding the circumference of the external terminal 16a. As a result, in the ground conductor 22, a conductor-missing portion Oa is provided in a region surrounded by the terminal conductor 22b. The external terminal 16a and an end portion of the signal line 20 on the negative direction side in the x-axis direction are located within the conductor-missing portion Oa in a planar view from the z-axis direction. The terminal conductor 22b is connected to an end portion of the main conductor 22a on the negative direction side in the x-axis direction.

The terminal conductor 22c is provided on the front surface of the connection portion 18a-c, and has a ring-shaped rectangular or substantially rectangular shape surrounding the circumference of the external terminal 16b. As a result, in the ground conductor 22, a conductor-missing portion Ob is provided in a region surrounded by the terminal conductor 22c. The external terminal 16b and an end portion of the signal line 20 on the positive direction side in the x-axis direction are located within the conductor-missing portion Ob in a planar view from the z-axis direction. The terminal conductor 22c is connected to an end portion of the main conductor 22a on the positive direction side in the x-axis direction.

Since a protective layer 14 and adjustment plates 15a and 15b in the high-frequency signal transmission line 10b are the same as the protective layer 14 and the adjustment plates 15a and 15b in the high-frequency signal transmission line 10a, the description thereof will be omitted.

As described above, in the high-frequency signal transmission lines 10 and 10a, the conductor-missing portions Oa and Ob are provided in the ground conductors 24 and 25 provided on the negative direction side in the z-axis direction, compared with the signal line 20 (in other words, on the back surface side of the dielectric body 12). On the other hand, as illustrated in FIG. 12, in the high-frequency signal transmission line 10b, the ground conductor 24 or 25 does not exist in which the conductor-missing portions Oa and Ob are provided. Instead, in the high-frequency signal transmission line 10b, the conductor-missing portions Oa and Ob are provided in the ground conductor 22 provided on the positive direction side in the z-axis direction, compared with the signal line 20 (in other words, on the front surface side of the dielectric body 12). In other words, the ground conductor 22, 24, or 25 in which the conductor-missing portions Oa and Ob are provided may also be provided on the positive direction side in the z-axis direction, compared with the signal line 20, and may also be provided on the negative direction side in the z-axis direction, compared with the signal line 20.

According to the high-frequency signal transmission line 10b configured in such a way as described above, it is possible to significantly reduce or prevent mismatching of characteristic impedances in the connectors 100a and 100b with respect to predetermined characteristic impedances, in the same way as the high-frequency signal transmission line 10a. In more detail, in the high-frequency signal transmission line 10b, the adjustment plates 15a and 15b are individually provided on the back surface of the dielectric body 12, and overlap with at least portions of the conductor-missing portions Oa and Ob, respectively, in a planar view from the z-axis direction. As a result, capacitances C2 turn out to be generated between the adjustment plates 15a and 15b and the end portions of the signal line 20. Furthermore, capacitances C3 turn out to be generated between the adjustment plates 15a and 15b and the terminal conductors 22b and 22c of the ground conductor 22. In other words, between the signal line 20 and the ground conductor 22, the capacitances C2 are C3 are connected in series, as illustrated in FIG. 7.

Here, when the capacitances C2 and C3 have been connected in series, the combined capacitance Ct of the capacitances C2 and C3 becomes a minute value. Accordingly, the minute combined capacitances Ct are generated in the connectors 100a and 100b, and it is possible to slightly reduce the characteristic impedances of the connectors 100a and 100b. In other words, it is possible to finely adjust the characteristic impedances of the connectors 100a and 100b. As a result, in the high-frequency signal transmission line 10b, by providing the conductor-missing portions Oa and Ob and the adjustment plates 15a and 15b, it is possible to match the characteristic impedances of the connectors 100a and 100b to the predetermined characteristic impedances with a high degree of accuracy.

In addition, in the high-frequency signal transmission line 10*b*, in the same way as the high-frequency signal transmission line 10*a*, the large deformations of the connection portions 12*b* and 12*c* are significantly reduced or prevented, and the damages of the connection portions 12*b* and 12*c* are significantly reduced or prevented.

Furthermore, in the high-frequency signal transmission line 10*b*, in a case of being disposed in an electronic device such as the electronic device 200 illustrated in FIGS. 5A and 5B, the flat plate-shaped ground conductor 22 is disposed on the battery pack 206 side, compared with the signal line 20. Therefore, it is possible to significantly reduce or prevent electrical interference from the battery pack 206 side to the signal line 20. Accordingly, it is possible to obtain a high-frequency signal transmission line whose transmission loss is small even if a metal member such as the battery pack 206 is near.

First Example of Modification

Figure 13A:
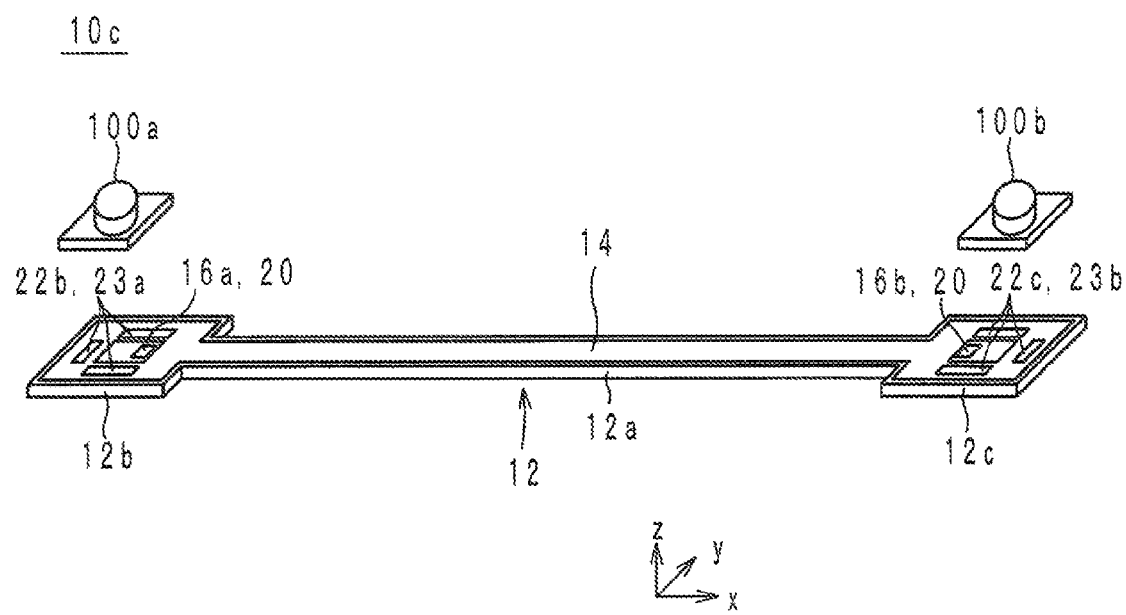
FIGS. 13A and 13B are appearance perspective views of a high-frequency signal transmission line according to a first example of a modification of a preferred embodiment of the present invention.
Figure 13B:
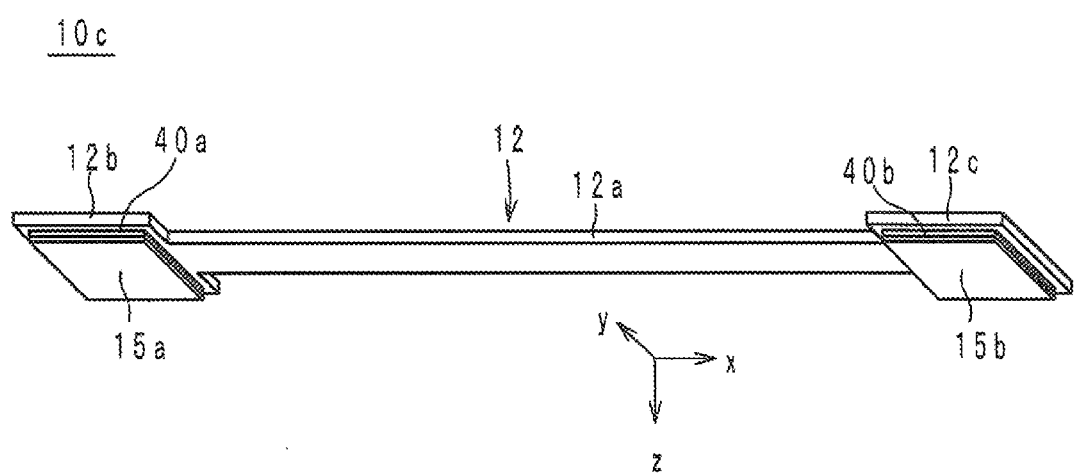

Hereinafter, a high-frequency signal transmission line according to a first example of a modification of a preferred embodiment of the present invention will be described with reference to drawings. FIGS. 13A and 13B are appearance perspective views of a high-frequency signal transmission line 10*c* according to the first example of a modification.

The internal configuration of the high-frequency signal transmission line 10*c* preferably is the same as the internal configuration of any one of the high-frequency signal transmission lines 10 and 10*a*. The high-frequency signal transmission line 10*c* is different from the high-frequency signal transmission lines 10 and 10*a* in a method for sticking the adjustment plates 15*a* and 15*b*. In more detail, in the high-frequency signal transmission lines 10 and 10*a*, the adjustment plates 15*a* and 15*b* are stuck to the dielectric body 12 preferably using an adhesive. In general, the adhesive preferably is a relatively thin layer.

On the other hand, in the high-frequency signal transmission line 10*c*, the adjustment plates 15*a* and 15*b* are stuck to the dielectric body 12 using relatively thick adhesive sheets 40*a* and 40*b* (adhesives). Accordingly, by adjusting the thicknesses of the adhesive sheets 40*a* and 40*b*, it is possible to adjust the magnitudes of capacitances between the adjustment plates 15*a* and 15*b* and the signal line 20 and the magnitudes of capacitances between the adjustment plates 15*a* and 15*b* and the ground conductors 24 and 25. Accordingly, it is only necessary to design the thicknesses of the adhesive sheets 40*a* and 40*b* so that the characteristic impedances of the connectors 100*a* and 100*b* become a predetermined characteristic impedance (e.g., about 50Ω).

Second Example of Modification

Figure 14A:
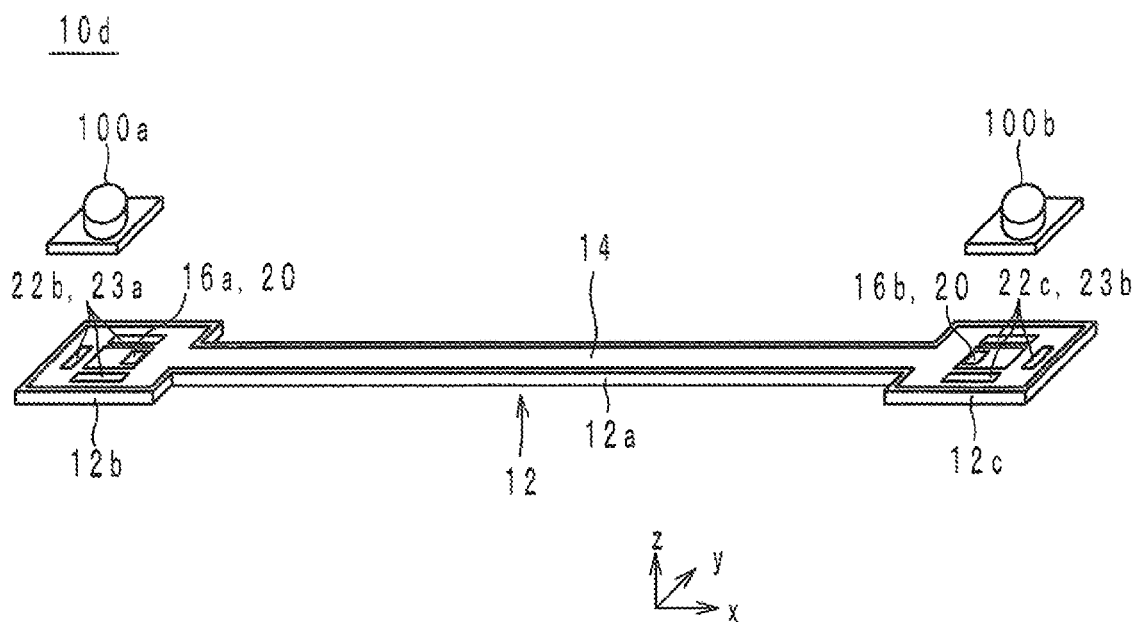
FIGS. 14A and 14B are appearance perspective views of a high-frequency signal transmission line according to a second example of a modification of a preferred embodiment of the present invention.
Figure 14B:
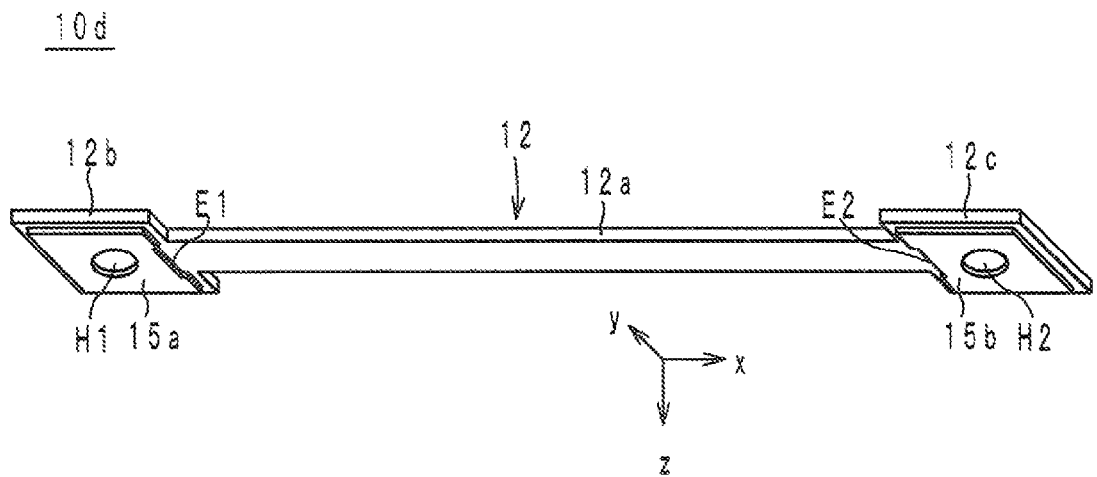

Hereinafter, a high-frequency signal transmission line according to a second example of a modification of a preferred embodiment of the present invention will be described with reference to drawings. FIGS. 14A and 14B are appearance perspective views of a high-frequency signal transmission line 10*d* according to the second example of a modification.

The internal configuration of the high-frequency signal transmission line 10*d* preferably is the same as the internal configuration of any one of the high-frequency signal transmission lines 10 and 10*a*. The high-frequency signal transmission line 10*d* is different from the high-frequency signal transmission lines 10 and 10*a* in the shapes of the adjustment plates 15*a* and 15*b*. In more detail, in the high-frequency signal transmission lines 10 and 10*a*, the adjustment plates 15*a* and 15*b* preferably have rectangular or substantially rectangular shapes.

On the other hand, in the high-frequency signal transmission line 10*d*, holes H1 and H2 and cutouts E1 and E2 are provided in the adjustment plates 15*a* and 15*b*. In this way, by providing the holes H1 and H2 and the cutouts E1 and E2, it is possible to adjust the magnitudes of capacitances between the adjustment plates 15*a* and 15*b* and the signal line 20 and the magnitudes of capacitances between the adjustment plates 15*a* and 15*b* and the ground conductors 24 and 25. Accordingly, it is only necessary to design the shapes of the adjustment plates 15*a* and 15*b* so that the characteristic impedances of the connectors 100*a* and 100*b* become a predetermined characteristic impedance (e.g., about 50Ω).

Fourth Preferred Embodiment

Figure 17:
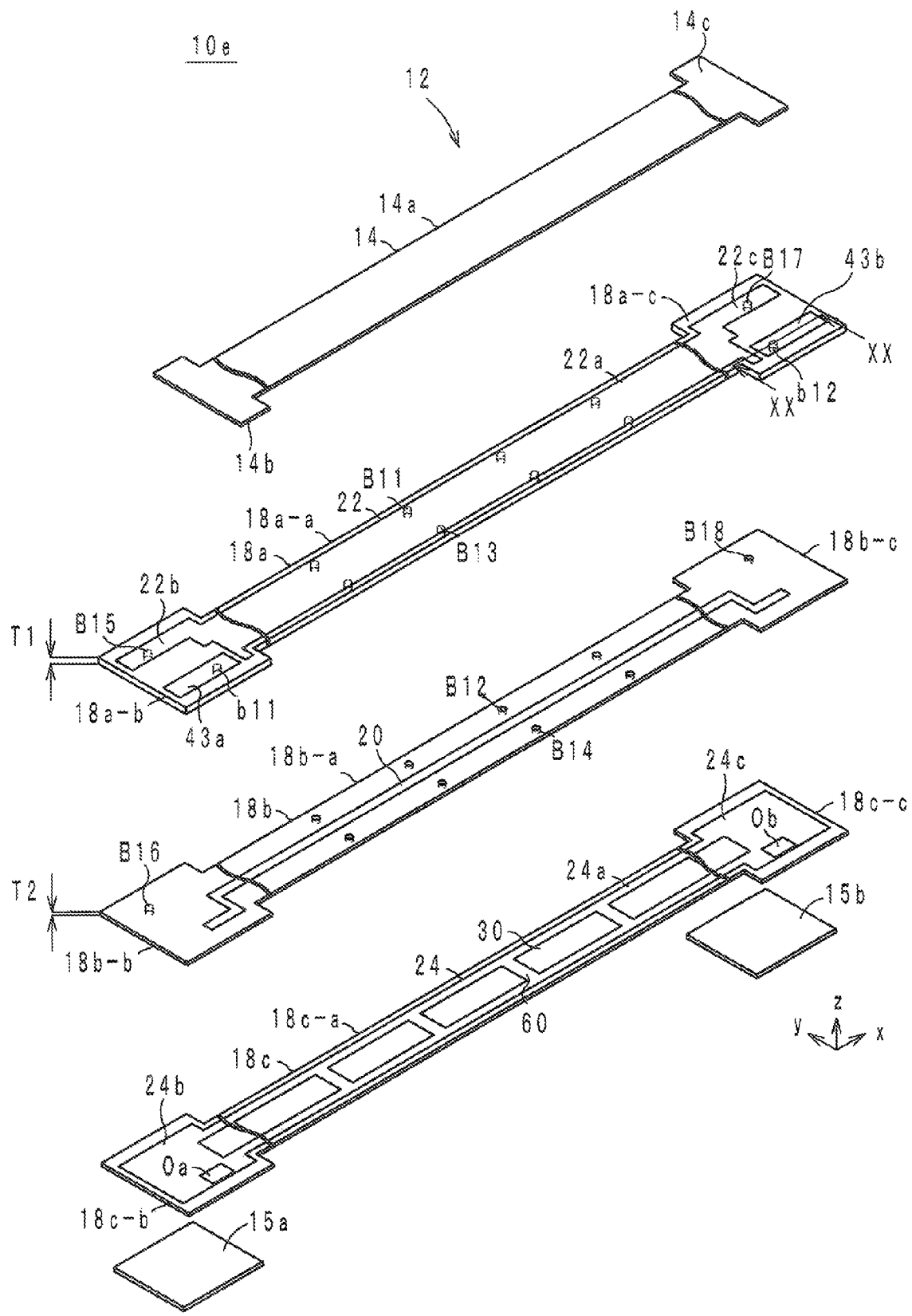
FIG. 17 is an exploded perspective view of a dielectric body of the high-frequency signal transmission line in FIG. 15.

Hereinafter, the configuration of a high-frequency signal transmission line 10*e* according to a fourth preferred embodiment of the present invention will be described with reference to drawings. FIG. 15 and FIG. 16 are appearance perspective views of the high-frequency signal transmission line 10*e* according to the fourth preferred embodiment. FIG. 17 is an exploded perspective view of the dielectric body 12 of the high-frequency signal transmission line 10*e* in FIG. 15. In what follows, the lamination direction of the high-frequency signal transmission line 10*e* is defined as a z-axis direction. In addition, the longitudinal direction of the high-frequency signal transmission line 10*e* is defined as an x-axis direction, and a direction perpendicular to the x-axis direction and the z-axis direction is defined as a y-axis direction.

The high-frequency signal transmission line 10*e* is not connected to a circuit substrate through the connectors 100*a* and 100*b* but connected to a circuit substrate through terminal conductors 22*b*, 22*c*, 43*a*, and 43*b*.

The high-frequency signal transmission line 10*e* is a flat-cable flexible circuit substrate preferably used to connect two high-frequency circuits within, for example, an electronic device such as a cellular phone. As illustrated in FIG. 15 to FIG. 17, the high-frequency signal transmission line 10*e* includes the dielectric body 12, adjustment plates 15*a* and 15*b*, a signal line 20, ground conductors 22 and 24, terminal conductors 43*a* and 43*b*, and via hole conductors b11, b12, and B11 to B18.

As illustrated in FIG. 15 and FIG. 16, in a planar view from the z-axis direction, the dielectric body 12 is a plate-shaped member having flexibility and extending in the x-axis direction, and includes a line portion 12*a* and connection portions 12*b* and 12*c*. As illustrated in FIG. 17, the dielectric body 12 is a laminated body including a protective layer 14 and dielectric sheets 18*a* to 18*c* that are laminated in this order from the positive direction side in the z-axis direction to the negative direction side therein. In what follows, the main surface of the dielectric body 12 on a positive direction side in the z-axis direction is referred to as a front surface, and the main surface of the dielectric body 12 on a negative direction side in the z-axis direction is referred to as a back surface.

As illustrated in FIG. 15 and FIG. 16, the line portion 12*a* extends in the x-axis direction. The connection portions 12*b* and 12*c* are connected to an end portion of the line portion 12*a* on a negative direction side in the x-axis direction and an end portion of the line portion 12*a* on a positive direction side in the x-axis direction, respectively, and have respective rectangular shapes. The widths of the connection portions 12*b* and 12*c* in the y-axis direction are larger than the width of the line portion 12*a* in the y-axis direction.

As illustrated in FIG. 17, the dielectric sheets 18a to 18c extend in the x-axis direction, and preferably have the same or substantially the same shape as the dielectric body 12 in a planar view from the z-axis direction. The dielectric sheets 18a to 18c are preferably made of a thermoplastic resin having flexibility, such as polyimide or liquid crystalline polymer. Hereinafter, the main surfaces of the dielectric sheets 18a to 18c on the positive direction side in the z-axis direction are referred to as front surfaces, and the main surfaces of the dielectric sheets 18a to 18c on the negative direction side in the z-axis direction are referred to as back surfaces.

As illustrated in FIG. 17, the thickness T1 of the dielectric sheet 18a is larger than the thickness T2 of the dielectric sheet 18b. After the lamination of the dielectric sheets 18a to 18c, the thickness T1 preferably ranges, for example, from about 50 μm to about 300 μm. In the present preferred embodiment, the thickness T1 preferably is about 150 μm, for example. In addition, the thickness T2 preferably ranges, for example, from about 10 μm to about 100 μm, for example. In the present preferred embodiment, the thickness T2 preferably is about 50 μm, for example.

In addition, as illustrated in FIG. 17, the dielectric sheet 18a includes a line portion 18a-a and connection portions 18a-b and 18a-c. As illustrated in FIG. 17, the dielectric sheet 18b includes a line portion 18b-a and connection portions 18b-b and 18b-c. The dielectric sheet 18c includes a line portion 18c-a and connection portions 18c-b and 18c-c. The line portions 18a-a, 18b-a, and 18c-a configure the line portion 12a. The connection portions 18a-b, 18b-b, and 18c-b define the connection portion 12b. The connection portions 18a-c, 18b-c, and 18c-c define the connection portion 12c.

As illustrated in FIG. 17, the signal line 20 is a linear conductor through which a high-frequency signal is transmitted and which is provided within the dielectric body 12. In the present preferred embodiment, the signal line 20 is a linear conductor that is provided on the front surface of the dielectric sheet 18b and extends in the x-axis direction.

As illustrated in FIG. 17, an end portion of the signal line 20 on the negative direction side in the x-axis direction is located on a negative direction side in the y-axis direction, compared with the center of the connection portion 18b-b. As illustrated in FIG. 17, an end portion of the signal line 20 on the positive direction side in the x-axis direction is located on the negative direction side in the y-axis direction, compared with the center of the connection portion 18b-c. The signal line 20 is manufactured using a metal material whose specific resistance is small and whose main component is silver or copper. Here, that the signal line 20 is provided on the front surface of the dielectric sheet 18b indicates that metal foil formed on the front surface of the dielectric sheet 18b by plating is subjected to patterning and thus the signal line 20 is formed or that metal foil stuck to the front surface of the dielectric sheet 18b is subjected to patterning and thus the signal line 20 is formed. In addition, since smoothing is performed on the surface of the signal line 20, the surface roughness of a surface in contact with the dielectric sheet 18b in the signal line 20 becomes larger than the surface roughness of a surface not in contact with the dielectric sheet 18b in the signal line 20.

As illustrated in FIG. 17, the ground conductor 22 is a flat plate-shaped conductor layer provided on the positive direction side in the z-axis direction, compared with the signal line 20. In more detail, the ground conductor 22 is provided on the front surface of the dielectric sheet 18a, and faces the signal line 20 across the dielectric sheet 18a. In the ground conductor 22, no opening is provided in a position in which to overlap with the signal line 20. The ground conductor 22 is manufactured using a metal material whose specific resistance is small and whose main component is silver or copper.

Here, that the ground conductor 22 is provided on the front surface of the dielectric sheet 18a indicates that metal foil formed on the front surface of the dielectric sheet 18a by plating is subjected to patterning and thus the ground conductor 22 is formed or that metal foil stuck to the front surface of the dielectric sheet 18a is subjected to patterning and thus the ground conductor 22 is formed. In addition, since smoothing is performed on the surface of the ground conductor 22, the surface roughness of a surface in contact with the dielectric sheet 18a in the ground conductor 22 becomes larger than the surface roughness of a surface not in contact with the dielectric sheet 18a in the ground conductor 22.

In addition, as illustrated in FIG. 17, the ground conductor 22 includes a main conductor 22a and terminal conductors 22b and 22c. The main conductor 22a is provided on the front surface of the line portion 18a-a, and extends in the x-axis direction. The terminal conductor 22b is a rectangular or substantially rectangular conductor provided on the front surface of the connection portion 18a-b. In more detail, the terminal conductor 22b extends in the x-axis direction on a positive direction side in the y-axis direction, compared with the center of the connection portion 18a-b, and functions as an external electrode. The terminal conductor 22b is connected to an end portion of the main conductor 22a on the negative direction side in the x-axis direction.

The terminal conductor 22c is a rectangular or substantially rectangular conductor provided on the front surface of the connection portion 18a-c. In more detail, the terminal conductor 22c extends in the x-axis direction on the positive direction side in the y-axis direction, compared with the center of the connection portion 18a-c, and functions as an external electrode. The terminal conductor 22c is connected to an end portion of the main conductor 22a on the positive direction side in the x-axis direction.

Here, the characteristic impedance of the high-frequency signal transmission line 10e is defined mainly on the basis of a facing area and a distance between the signal line 20 and the ground conductor 22 and the relative permittivities of the dielectric sheets 18a to 18c. Therefore, in a case where the characteristic impedance of the high-frequency signal transmission line 10e is set to 50Ω, designing is performed, for example, so that the characteristic impedance of the high-frequency signal transmission line 10e becomes 55Ω, for example, because of the signal line 20 and the ground conductor 22, the 55Ω being slightly higher than 50Ω. In addition, the shape of the ground conductor 24 is adjusted so that the characteristic impedance of the high-frequency signal transmission line 10e becomes 50Ω because of the signal line 20, the ground conductor 22, and the ground conductor 24. As described above, the ground conductor 22 functions as a reference-ground electrode.

As illustrated in FIG. 17, the ground conductor 24 is a conductor layer provided on the negative direction side in the z-axis direction, compared with the signal line 20. In more detail, the ground conductor 24 is provided on the front surface of the dielectric sheet 18c, and faces the signal line 20 across the dielectric sheet 18b. The ground conductor 24 is manufactured using a metal material whose specific resistance is small and whose main component is silver or copper.

Here, that the ground conductor 24 is provided on the front surface of the dielectric sheet 18c indicates that metal foil formed on the front surface of the dielectric sheet 18c by plating is subjected to patterning and thus the ground conductor 24 is formed or that metal foil stuck to the front surface of the dielectric sheet 18c is subjected to patterning and thus the ground conductor 24 is formed. In addition, since smoothing is performed on the surface of the ground conductor 24, the surface roughness of a surface in contact with the dielectric sheet 18c in the ground conductor 24 becomes larger than the surface roughness of a surface not in contact with the dielectric sheet 18c in the ground conductor 24.

In addition, as illustrated in FIG. 17, the ground conductor 24 includes a main conductor 24a and terminal conductors 24b and 24c. The main conductor 24a is provided on the front surface of the line portion 18c-a, and extends in the x-axis direction. The terminal conductor 24b is provided on the front surface of the connection portion 18c-b, and preferably has a rectangular or substantially rectangular shape. The terminal conductor 24b is connected to an end portion of the main conductor 24a on the negative direction side in the x-axis direction. In this regard, however, in the terminal conductor 24b, a rectangular or substantially rectangular conductor-missing portion Oa is provided. In a planar view from the z-axis direction, the conductor-missing portion Oa overlaps with an end portion of the signal line 20 on the negative direction side in the x-axis direction. The terminal conductor 24c is provided on the front surface of the connection portion 18c-c, and has a rectangular shape. The terminal conductor 24c is connected to an end portion of the main conductor 24a on the positive direction side in the x-axis direction. In this regard, however, in the terminal conductor 24c, a rectangular or substantially rectangular conductor-missing portion Ob is provided. In a planar view from the z-axis direction, the conductor-missing portion Ob overlaps with an end portion of the signal line 20 on the positive direction side in the x-axis direction.

In addition, as illustrated in FIG. 17, in the main conductor 24a, a plurality of openings 30 are provided that are arranged in the x-axis direction and have rectangular or substantially rectangular shapes. As a result, the main conductor 24a has a ladder shape. In addition, in the ground conductor 24, a portion sandwiched between the openings 30 adjacent to each other is referred to as a bridge portion 60. The bridge portion 60 extends in the y-axis direction. In a planar view from the z-axis direction, the plural openings 30 and the plural bridge portions 60 alternately overlap with the signal line 20. In addition, in the present preferred embodiment, the signal line 20 passes over, in the x-axis direction, the centers of the openings 30 and the bridge portions 60 in the y-axis direction.

The ground conductor 24 is an auxiliary ground conductor also functioning as a shield. In addition, as described above, the ground conductor 24 is designed in order to make a final adjustment so that the characteristic impedance of the high-frequency signal transmission line 10e becomes 50Ω, for example. Specifically, the size of the opening 30, the line width of the bridge portion 60, and so forth are designed.

As described above, no opening is provided in the ground conductor 22, and the opening 30 is provided in the ground conductor 24. Accordingly, an area where the ground conductor 24 and the signal line 20 face each other is smaller than an area where the ground conductor 22 and the signal line 20 face each other.

The terminal conductor 43a is a rectangular or substantially rectangular conductor provided on the front surface of the connection portion 18a-b, and functions as an external electrode. In more detail, the terminal conductor 43a extends in the x-axis direction, on the negative direction side in the y-axis direction, compared with the center of the connection portion 18a-b. In addition, in a planar view from the z-axis direction, an end portion of the terminal conductor 43a on the positive direction side in the x-axis direction overlaps with an end portion of the signal line 20 on the negative direction side in the x-axis direction.

The terminal conductor 43b is a rectangular or substantially rectangular conductor provided on the front surface of the connection portion 18a-c, and functions as an external electrode. In more detail, the terminal conductor 43b extends in the x-axis direction, on the negative direction side in the y-axis direction, compared with the center of the connection portion 18a-c. In addition, in a planar view from the z-axis direction, an end portion of the terminal conductor 43b on the negative direction side in the x-axis direction overlaps with an end portion of the signal line 20 on the positive direction side in the x-axis direction.

The signal line 20, the ground conductors 22 and 24, and the terminal conductors 43a and 43b have approximately the same thicknesses. The thicknesses of the signal line 20, the ground conductors 22 and 24, and the terminal conductors 43a and 43b preferably range, for example, from about 10 μm to about 20 μm.

As described above, the signal line 20 is sandwiched from both sides thereof in the z-axis direction, by the ground conductor 22 and the ground conductor 24. In other words, the signal line 20, the ground conductor 22, and the ground conductor 24 define a triplate-type strip line structure. In addition, as illustrated in FIG. 17, an interval (a distance in the z-axis direction) between the signal line 20 and the ground conductor 22 is approximately equal to the thickness T1 of the dielectric sheet 18a, and preferably ranges, for example, from about 50 μm to about 300 μm. In the present preferred embodiment, the interval between the signal line 20 and the ground conductor 22 preferably is about 150 μm, for example. In addition, as illustrated in FIG. 17, an interval (a distance in the z-axis direction) between the signal line 20 and the ground conductor 24 is approximately equal to the thickness T2 of the dielectric sheet 18b, and preferably ranges, for example, from about 10 μm to about 100 μm. In the present preferred embodiment, the interval between the signal line 20 and the ground conductor 24 preferably is about 50 μm, for example. Accordingly, the distance between the signal line 20 and the ground conductor 24 in the z-axis direction is smaller than the distance between the signal line 20 and the ground conductor 22 in the z-axis direction.

As illustrated in FIG. 17, the plural via hole conductors B11 penetrate the dielectric sheet 18a in the z-axis direction, on the positive direction side in the y-axis direction compared with the signal line 20, and are laid out in a line in the x-axis direction at equal intervals. As illustrated in FIG. 17, the plural via hole conductors B12 penetrate the dielectric sheet 18b in the z-axis direction, on the positive direction side in the y-axis direction compared with the signal line 20, and are laid out in a line in the x-axis direction at equal intervals. The via hole conductors B11 and B12 configure one via hole conductor by being connected to each other. In addition, an end portion of the via hole conductor B11 on the positive direction side in the z-axis direction is connected to the ground conductor 22. An end portion of the via hole conductor B12 on the negative direction side in the z-axis direction is connected to the ground conductor 24, and, in more detail, connected to the ground conductor 24 on the positive direction side in the y-axis direction, compared with the bridge portion 60. Via holes formed in the dielectric sheets 18a and 18b have been filled with a conductive paste whose main component is silver, tin, copper, or the like, the conductive paste has been solidified, and hence the via hole conductors B11 and B12 are formed.

As illustrated in FIG. 17, the plural via hole conductors B13 penetrate the dielectric sheet 18a in the z-axis direction, on the negative direction side in the y-axis direction compared with the signal line 20, and are laid out in a line in the x-axis direction at equal intervals. As illustrated in FIG. 17, the plural via hole conductors B14 penetrate the dielectric sheet 18b in the z-axis direction, on the negative direction side in the y-axis direction compared with the signal line 20, and are laid out in a line in the x-axis direction at equal intervals. The via hole conductors B13 and B14 configure one via hole conductor by being connected to each other. In addition, an end portion of the via hole conductor B13 on the positive direction side in the z-axis direction is connected to the ground conductor 22. An end portion of the via hole conductor B14 on the negative direction side in the z-axis direction is connected to the ground conductor 24, and, in more detail, connected to the ground conductor 24 on the negative direction side in the y-axis direction, compared with the bridge portion 60. Via holes formed in the dielectric sheets 18a and 18b have been filled with a conductive paste whose main component is silver, tin, copper, or the like, the conductive paste has been solidified, and hence the via hole conductors B13 and B14 are formed.

As illustrated in FIG. 17, the via hole conductor B15 penetrates the connection portion 18a-b of the dielectric sheet 18a in the z-axis direction. As illustrated in FIG. 17, the via hole conductor B16 penetrates the connection portion 18b-b of the dielectric sheet 18b in the z-axis direction. The via hole conductors B15 and B16 define one via hole conductor by being connected to each other. In addition, an end portion of the via hole conductor B15 on the positive direction side in the z-axis direction is connected to the terminal conductor 22b of the ground conductor 22. An end portion of the via hole conductor B16 on the negative direction side in the z-axis direction is connected to the terminal conductor 24b of the ground conductor 24. Via holes formed in the dielectric sheets 18a and 18b have been filled with a conductive paste whose main component is silver, tin, copper, or the like, the conductive paste has been solidified, and hence the via hole conductors B15 and B16 are formed.

As illustrated in FIG. 17, the via hole conductor B17 penetrates the connection portion 18a-c of the dielectric sheet 18a in the z-axis direction. As illustrated in FIG. 17, the via hole conductor B18 penetrates the connection portion 18b-c of the dielectric sheet 18b in the z-axis direction. The via hole conductors B17 and B18 define one via hole conductor by being connected to each other. In addition, an end portion of the via hole conductor B17 on the positive direction side in the z-axis direction is connected to the terminal conductor 22c of the ground conductor 22. An end portion of the via hole conductor B18 on the negative direction side in the z-axis direction is connected to the terminal conductor 24c of the ground conductor 24. Via holes formed in the dielectric sheets 18a and 18b have been filled with a conductive paste whose main component is silver, tin, copper, or the like, the conductive paste has been solidified, and hence the via hole conductors B17 and B18 are formed.

As illustrated in FIG. 17, the via hole conductor b11 penetrates the connection portion 18a-b of the dielectric sheet 18a in the z-axis direction, and connects the terminal conductor 43a and an end portion of the signal line 20 on the negative direction side in the x-axis direction to each other. As illustrated in FIG. 17, the via hole conductor b12 penetrates the connection portion 18a-c of the dielectric sheet 18a in the z-axis direction, and connects the terminal conductor 43b and an end portion of the signal line 20 on the positive direction side in the x-axis direction to each other. As a result, the signal line 20 is connected between the terminal conductors 43a and 43b. Via holes formed in the dielectric sheets 18a and 18b have been filled with a conductive paste whose main component is silver, tin, copper, or the like, the conductive paste has been solidified, and hence the via hole conductors b11 and b12 are formed.

The protective layer 14 is insulation film provided on the front surface of the dielectric sheet 18a, and covers substantially the entire surface of the front surface of the dielectric sheet 18a. As a result, the protective layer 14 covers the ground conductor 22. The protective layer 14 is made of, for example, a flexible resin such as a resist material.

In addition, as illustrated in FIG. 17, the protective layer 14 includes a line portion 14a and connection portions 14b and 14c. The line portion 14a covers the main conductor 22a by covering the entire surface of the front surface of the line portion 18a-a.

The connection portion 14b is connected to an end portion of the line portion 14a on the negative direction side in the x-axis direction, and covers a portion of the front surface of the connection portion 18a-b. In this regard, however, as illustrated in FIG. 15, the connection portion 14b does not cover the terminal conductors 22b and 43a.

The connection portion 14c is connected to an end portion of the line portion 14a on the positive direction side in the x-axis direction, and covers a portion of the front surface of the connection portion 18a-c. In this regard, however, as illustrated in FIG. 15, the connection portion 14c does not cover the terminal conductors 22c and 43b.

The adjustment plate 15a is provided on the back surface of the connection portion 12b of the dielectric body 12 (in other words, the back surface of the connection portion 18c-b of the dielectric sheet 18c), and a rectangular or substantially rectangular metal plate overlapping with at least a portion of the conductor-missing portion Oa in a planar view from the z-axis direction. Furthermore, the adjustment plate 15a is not electrically connected to any one of the signal line 20 and the ground conductors 22 and 24, and is maintained at a floating potential. In more detail, the adjustment plate 15a overlaps with the whole of the conductor-missing portion Oa in a planar view from the z-axis direction, and hence, overlaps with an end portion of the signal line 20 on the negative direction side in the x-axis direction. As a result, capacitance is generated between the adjustment plate 15a and an end portion of the signal line 20 on the negative direction side in the x-axis direction. Furthermore, the adjustment plate 15a protrudes out of the conductor-missing portion Oa, and hence, overlaps with the terminal conductor 24b of the ground conductor 24 in a planar view from the z-axis direction. As a result, capacitance is generated between the adjustment plate 15a and the terminal conductor 24b of the ground conductor 24.

The adjustment plate 15b is provided on the back surface of the connection portion 12c of the dielectric body 12 (in other words, the back surface of the connection portion 18c-c of the dielectric sheet 18c), and a rectangular or substantially rectangular metal plate overlapping with at least a portion of the conductor-missing portion Ob in a planar view from the z-axis direction. Furthermore, the adjustment plate 15b is not electrically connected to any one of the signal line 20 and the ground conductors 22 and 24, and is maintained at a floating potential. In more detail, the adjustment plate 15b overlaps with the whole of the conductor-missing portion Ob in a planar view from the z-axis direction, and hence, overlaps with an end portion of the signal line 20 on the positive direction side in the x-axis direction. As a result, capacitance is generated between the adjustment plate 15b and an end portion of the signal line 20 on the positive direction side in the x-axis direction. Furthermore, the adjustment plate 15b protrudes out of the conductor-missing portion Ob, and hence, overlaps with the terminal conductor 24c of the ground conductor 24 in a planar view from the z-axis direction. As a result, capacitance is generated between the adjustment plate 15b and the terminal conductor 24c of the ground conductor 24. The adjustment plates 15a and 15b are defined by, for example, copper plates or SUS plates.

Figure 18:
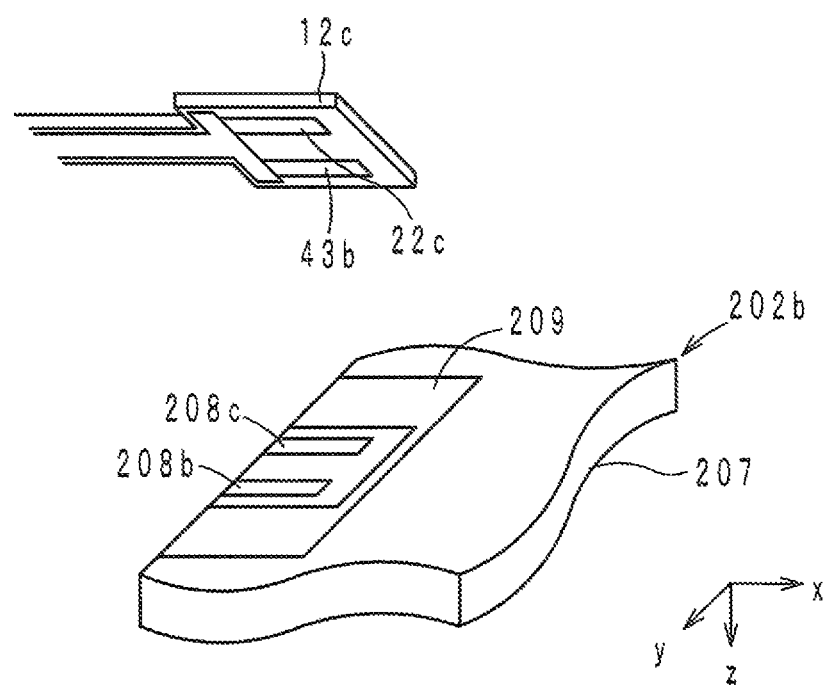
FIG. 18 is a perspective view of a connection portion between a high-frequency signal transmission line and a circuit substrate.
Figure 19:
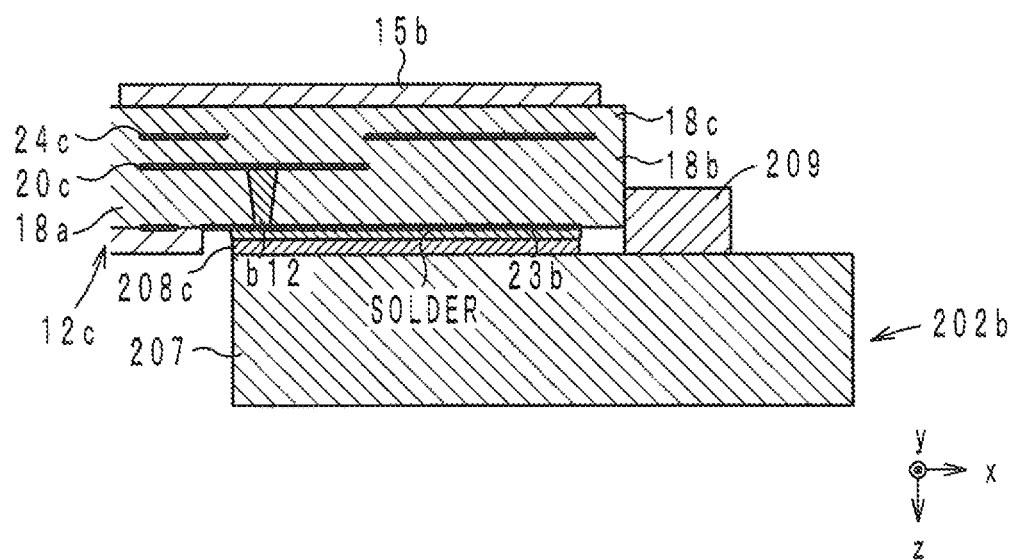
FIG. 19 is a cross-sectional structural view of a connection portion between a high-frequency signal transmission line and a circuit substrate.

Next, a connection structure between the high-frequency signal transmission line 10e and a circuit substrate will be described with reference to drawings. FIG. 18 is a perspective view of a connection portion between the high-frequency signal transmission line 10e and a circuit substrate 202b. FIG. 19 is a cross-sectional structural view of the connection portion between the high-frequency signal transmission line 10e and the circuit substrate 202b. In addition, a connection structure between the high-frequency signal transmission line 10e and a circuit substrate 202a and a connection structure between the high-frequency signal transmission line 10e and the circuit substrate 202b are equal to each other. Therefore, hereinafter, the connection structure between the high-frequency signal transmission line 10e and the circuit substrate 202b will be described.

As illustrated in FIG. 18, the circuit substrate 202b includes a substrate body 207, external terminals 208b and 208c, and a resist 209. The substrate body 207 embeds therein a feed circuit and so forth. The external terminals 208b and 208c are provided on the main surface of the substrate body 207 on the negative direction side in the z-axis direction, and arranged in this order from the positive direction side to the negative direction side in the y-axis direction. The external terminals 208b and 208c have rectangular or substantially rectangular shapes, and are manufactured using, for example, copper or the like. In a planar view from the z-axis, the direction resist 209 surrounds the circumferences of the external terminals 208b and 208c. As a result, the resist 209 also serves a function for the positioning of the high-frequency signal transmission line 10e. As illustrated in FIG. 19, the external terminals 208b and 208c are connected to the terminal conductors 22c and 43b, respectively, by a solder.

Figure 20:
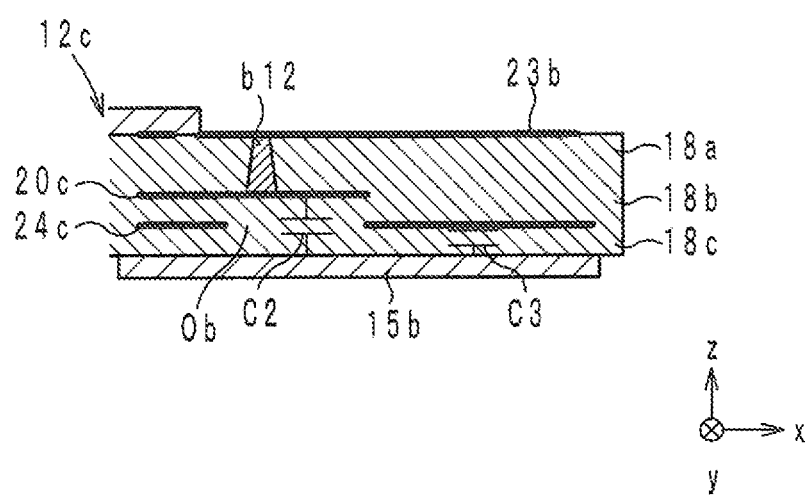
FIG. 20 is a cross-sectional structural view of the high-frequency signal transmission line taken along a line XX-XX in FIG. 17.

According to the high-frequency signal transmission line 10e configured in such a way as described above, it is possible to significantly reduce or prevent mismatching of the characteristic impedances of both end portions of the signal line 20 with respect to predetermined characteristic impedances. FIG. 20 is a cross-sectional structural view of the high-frequency signal transmission line 10e taken along a line XX-XX in FIG. 17.

In the high-frequency signal transmission line 10e, the adjustment plates 15a and 15b are individually provided on the back surface of the dielectric body 12, and overlap with at least portions of the conductor-missing portions Oa and Ob, respectively, in a planar view from the z-axis direction. As a result, as illustrated in FIG. 20, capacitances C2 turn out to be generated between the adjustment plates 15a and 15b and the end portions of the signal line 20. Furthermore, capacitances C3 turn out to be generated between the adjustment plates 15a and 15b and the terminal conductors 24b and 24c of the ground conductor 24. In other words, between the signal line 20 and the ground conductor 24, the capacitances C2 are C3 are connected in series, as illustrated in FIG. 20.

Here, when the capacitances C2 and C3 have been connected in series, the combined capacitance Ct of the capacitances C2 and C3 becomes a minute value. Accordingly, the minute combined capacitances Ct are generated in the end portions of the signal line 20, and it is possible to slightly reduce the characteristic impedances of the end portions of the signal line 20. In other words, it is possible to finely adjust the characteristic impedances of the end portions of the signal line 20. As a result, in the high-frequency signal transmission line 10e, by providing the conductor-missing portions Oa and Ob and the adjustment plates 15a and 15b, it is possible to match the characteristic impedances of the end portions of the signal line 20 to the predetermined characteristic impedances with a high degree of accuracy.

In addition, the terminal conductors 22c and 43b may also be connected to the external terminals 208b and 208c by welding, for example.

In addition, stainless-steel metal plates may also be provided above the terminal conductors 22b, 22c, 43a, and 43b. As a result, the deformations of the connection portions 12b and 12c are significantly reduced or prevented. In addition, since the material of the stainless-steel metal plate is different from the materials of the terminal conductors 22b, 22c, 43a, and 43b, the characteristic impedance of the metal plate is different from the characteristic impedances of the terminal conductors 22b, 22c, 43a, and 43b. Accordingly, the characteristic impedance of the metal plate is easily mismatched with respect to a predetermined characteristic impedance. Therefore, in a case where the metal plate is applied to the high-frequency signal transmission line 10e, it is only necessary to adjust the characteristic impedance of the metal plate because of the adjustment plates 15a and 15b.

Another Preferred Embodiment

A high-frequency signal transmission line according to the present invention is not limited to the high-frequency signal transmission lines 10 and 10a to 10e according to the above-mentioned preferred embodiments, and may be modified within the scope thereof.

In addition, the adjustment plates 15a and 15b may also be stuck to the dielectric body 12, using, for example, a resist material.

In addition, while it has been assumed that the adjustment plates 15a and 15b preferably are metal plates, the adjustment plates 15a and 15b may also be insulating substrates such as glass epoxy resins, in which, for example, conductor layers are provided. In this case, since it is possible to process the conductor layer by etching, it is possible to process the conductor layer with a high degree of accuracy. Accordingly, it is possible to match the characteristic impedances of the connectors 100a and 100b to predetermined characteristic impedances with a high degree of accuracy.

In addition, in the high-frequency signal transmission line 10a, the opening 30 may not exist in the ground conductor 24. In addition, the plural openings 30 may be provided not in the ground conductor 24 but in the ground conductor 22. Furthermore, the plural openings 30 may be provided in each of the ground conductors 22 and 24.

In addition, the configurations illustrated in the high-frequency signal transmission lines 10 and 10a to 10e may also be combined.

In addition, it is not necessary for the signal line 20 and the adjustment plates 15a and 15b to overlap with each other in a planar view. In this case, the capacitances C2 also occur between the signal line 20 and the adjustment plates 15a and 15b through the conductor-missing portions Oa and Ob. In the same way, it is not necessary for the ground conductors 22, 24, and 25 and the adjustment plates 15a and 15b to overlap with each other in a planar view.

In addition, the connectors 100*a* and 100*b* may also be provided on the respective different main surfaces of the dielectric body 12.

In addition, the high-frequency signal transmission lines 10 and 10*a* to 10*e* may also be used as high-frequency signal transmission lines in RF circuit substrates such as antenna front-end modules.

As described above, preferred embodiments of the present invention are useful for a high-frequency signal transmission line and an electronic device, and in particular, is superior in terms of significantly reducing or preventing mismatching of a characteristic impedance in a connector with respect to a predetermined characteristic impedance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
    a body including a plurality of insulator layers laminated on each other;
    a linear signal line provided in or on the body;
    a first ground conductor facing the signal line across at least one of the plurality of insulator layers; and
    an adjustment conductor; wherein
    the body includes a connection portion in which the signal line and an external circuit are electrically connected in a first main surface of the body, and a line portion in which the signal line is provided, the line portion extending from the connection portion;
    in the first ground conductor, a conductor-missing portion is provided in at least a portion of a region overlapping with the signal line, in a planar view from a lamination direction in the connection portion; and
    the adjustment conductor is provided in a second main surface of the body, and overlaps with at least a portion of the conductor-missing portion in the planar view from the lamination direction; and
    the adjustment conductor is not provided in the line portion.

2. The high-frequency signal transmission line according to claim 1, wherein a portion of the adjustment conductor overlaps with the signal line in the planar view of the body from the lamination direction.

3. The high-frequency signal transmission line according to claim 1, wherein the adjustment conductor includes an insulating substrate in which a metal plate or a conductor layer is provided.

4. The high-frequency signal transmission line according to claim 1, wherein the adjustment conductor is fixed to the body via an adhesive or a resist material.

5. The high-frequency signal transmission line according to claim 1, wherein the adjustment conductor is not electrically connected to the signal line or the first ground conductor.

6. The high-frequency signal transmission line according to claim 1, wherein the first ground conductor is provided on the first main surface side of the body, compared with the signal line.

7. The high-frequency signal transmission line according to claim 1, further comprising:
    an external electrode provided on the first main surface of the connection portion of the body and electrically connected to the signal line; wherein
    the signal line is electrically connected to the external circuit through the external electrode.

8. The high-frequency signal transmission line according to claim 1, wherein capacitance is generated between the adjustment conductor and the signal line and capacitance is generated between the adjustment conductor and the first ground conductor.

9. The high-frequency signal transmission line according to claim 1, further comprising:
    a second ground conductor provided on the first main surface side of the body, compared with the signal line, and facing the signal line across at least one of the plurality of insulator layers; wherein
    the first ground conductor is provided on the second main surface side of the body, compared with the signal line; and
    a plurality of openings are provided in at least one of the first ground conductor and the second ground conductor, the plurality of openings being arranged along the signal line in the planar view from the lamination direction.

10. The high-frequency signal transmission line according to claim 9, wherein
    a characteristic impedance of the signal line in a first region overlapping with the openings is higher than a characteristic impedance of the signal line in a second region not overlapping with the openings; and
    the characteristic impedance of the signal line in the first region and the characteristic impedance of the signal line in the second region are set so that a characteristic impedance of an entirety of the signal line is a predetermined characteristic impedance.

11. The high-frequency signal transmission line according to claim 1, further comprising:
    a connector is mounted on the first main surface of the connection portion of the body, and is electrically connected to the signal line; wherein
    the signal line is electrically connected to the external circuit through the connector.

12. The high-frequency signal transmission line according to claim 11, wherein the adjustment conductor is configured such that a characteristic impedance of the connector has a predetermined characteristic impedance.

13. An electronic device comprising:
    a high-frequency signal transmission line; and
    a housing containing the high-frequency signal transmission line; wherein
    the high-frequency signal transmission line includes:
        a body including a plurality of insulator layers laminated on each other;
        a linear signal line provided in or on the body;
        a first ground conductor facing the signal line across at least one of the plurality of insulator layers; and
        an adjustment conductor; wherein
        the body includes a connection portion in which the signal line and an external circuit are electrically connected in a first main surface of the body, and a line portion in which the signal line is provided, the line portion extending from the connection portion;
        in the first ground conductor, a conductor-missing portion is provided in at least a portion of a region overlapping with the signal line, in a planar view from a lamination direction in the connection portion; and
        the adjustment conductor is provided in a second main surface of the body, and overlaps with at least a portion of the conductor-missing portion in the planar view from the lamination direction; and the adjustment conductor is not provided in the line portion.

14. The electronic device according to claim 13, wherein a portion of the adjustment conductor overlaps with the signal line in the planar view of the body from the lamination direction.

15. The electronic device according to claim 13, wherein the adjustment conductor includes an insulating substrate in which a metal plate or a conductor layer is provided.

16. The electronic device according to claim 13, wherein the adjustment conductor is fixed to the body via an adhesive or a resist material.

17. The electronic device according to claim 13, wherein the adjustment conductor is not electrically connected to the signal line or the first ground conductor.

18. The electronic device according to claim 13, wherein the first ground conductor is provided on the first main surface side of the body, compared with the signal line.

19. The electronic device according to claim 13, further comprising:

a second ground conductor provided on the first main surface side of the body, compared with the signal line, and facing the signal line across at least one of the plurality of insulator layers; wherein the first ground conductor is provided on the second main surface side of the body, compared with the signal line; and a plurality of openings are provided in at least one of the first ground conductor and the second ground conductor, the plurality of openings being arranged along the signal line in the planar view from the lamination direction.

20. The electronic device according to claim 19, wherein a characteristic impedance of the signal line in a first region overlapping with the openings is higher than a characteristic impedance of the signal line in a second region not overlapping with the openings; and the characteristic impedance of the signal line in the first region and the characteristic impedance of the signal line in the second region are set so that a characteristic impedance of an entirety of the signal line is a predetermined characteristic impedance.

* * * * *